United States Patent
Chen et al.

(10) Patent No.: US 10,720,594 B2
(45) Date of Patent: Jul. 21, 2020

(54) LIGHT EMITTING DEVICE

(71) Applicant: INT TECH CO., LTD., Hsinchu County (TW)

(72) Inventors: Cheng-Hsin Chen, Hsinchu County (TW); Huei-Siou Chen, Taipei (TW); Li-Chen Wei, Taichung (TW)

(73) Assignee: INT TECH CO., LTD., Hsinchu (TW)

( * ) Notice: Subject to any disclaimer, the term of this patent is extended or adjusted under 35 U.S.C. 154(b) by 0 days.

(21) Appl. No.: 16/577,950

(22) Filed: Sep. 20, 2019

(65) Prior Publication Data

US 2020/0020872 A1 Jan. 16, 2020

Related U.S. Application Data

(63) Continuation-in-part of application No. 16/122,186, filed on Sep. 5, 2018, now Pat. No. 10,461,139, which is a continuation-in-part of application No. 15/995,838, filed on Jun. 1, 2018, now Pat. No. 10,193,098, which is a continuation-in-part of application No. 15/695,853, filed on Sep. 5, 2017.

(60) Provisional application No. 62/420,089, filed on Nov. 10, 2016.

(51) Int. Cl.
*H01L 51/50* (2006.01)
*H01L 33/62* (2010.01)
*H01L 51/52* (2006.01)

(52) U.S. Cl.
CPC ............ *H01L 51/508* (2013.01); *H01L 33/62* (2013.01); *H01L 51/5203* (2013.01)

(58) Field of Classification Search
CPC ............ H01L 27/3246; H01L 27/3211; H01L 51/0018; H01L 51/5088; H01L 51/5072; H01L 51/5056; H01L 51/56; H01L 51/5036; H01L 51/0097; H01L 51/5203; H01L 51/5092; H01L 51/5262; H01L 51/524; H01L 51/5096; H01L 51/5253; H01L 2251/5338; G02B 6/0008; H05K 7/1481; H05K 7/1427; H05K 5/0217; H04L 12/40013
See application file for complete search history.

*Primary Examiner* — Joseph L Williams
*Assistant Examiner* — Jose M Diaz
(74) *Attorney, Agent, or Firm* — WPAT, P.C., Intellectual Property Attorneys; Anthony King

(57) ABSTRACT

A light emitting device includes a substrate and a light emitting unit over the substrate. The light emitting unit includes a first electrode, an organic emissive layer over the first electrode, a first electron transportation layer over the organic emissive layer, and a metal-containing layer over the first transportation layer. An end of the first electron transportation layer meets the organic emissive layer and the metal-containing layer at a first meeting point, the organic emissive layer has an end which is close to the first meeting point meets the metal-containing layer at a second meeting point, the second meeting point is spaced apart from the first meeting point and away from the first electron transportation layer. Further, at least one of the first electron transportation layer and the metal-containing layer includes transitional metal or alkali metal.

18 Claims, 44 Drawing Sheets

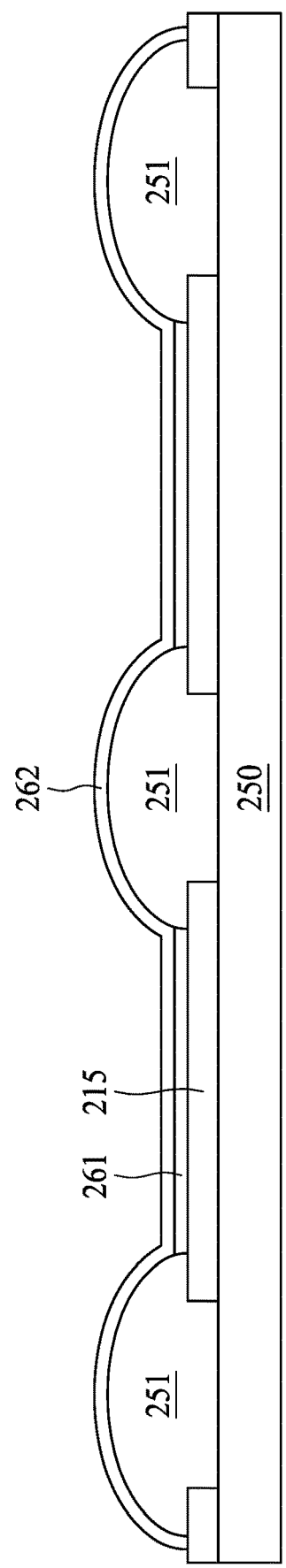

LIGHT EMITTING DEVICE

CROSS-REFERENCE TO RELATED APPLICATIONS

This application is a continuation-in-part application of a U.S. patent application entitled LIGHT EMITTING DEVICE MANUFACTURING METHOD AND APPARATUS THEREOF, Ser. No. 16/122,186, filed Sep. 5, 2018.

TECHNICAL FIELD

The present disclosure is related to light emitting device, especially to an organic light emitting device.

BACKGROUND

Organic light emitting display (OLED) has been used widely in most high end electron devices. However, due to the constraint of current technology, the pixel definition is realized by coating a light emitting material on a substrate through a mask, and often, the critical dimension on the mask can not be smaller than 100 microns. Therefore, pixel density having 800 ppi or higher becomes a difficult task for an OLED maker.

SUMMARY

In the present disclosure, the light emitting units are formed by a photo sensitive material. The photo sensitive material is directly disposed on a substrate without through a mask. The pixel definition is realized by a photolithography process.

A light emitting device includes a substrate and a light emitting unit over the substrate. The light emitting unit includes a first electrode, an organic emissive layer over the first electrode, a first electron transportation layer over the organic emissive layer, and a metal-containing layer over the first transportation layer, an end of the first electron transportation layer meets the organic emissive layer and the metal-containing layer at a first meeting point, the organic emissive layer has an end which is close to the first meeting point meets the metal-containing layer at a second meeting point, the second meeting point is spaced apart from the first meeting point and away from the first electron transportation layer. Further, at least one of the first electron transportation layer and the metal-containing layer includes transitional metal or alkali metal.

A light emitting device includes a substrate, a plurality of bumps over the substrate, first and second light emitting units between the bumps and over the substrate, and a metal-containing layer over the first electron transportation layers of the first and second light emitting units. Each of the first and second light emitting units includes a first electrode and an organic emissive layer over the first electrode; and a first electron transportation layer over the organic emissive layer, at least one of the first electron transportation layer and the metal-containing layer includes transitional metal or alkali metal. The thickness of the first electron transportation layer of the first light emitting unit is different from the thickness of the first electron transportation layer of the second light emitting unit.

A light emitting device includes a substrate, a plurality of bumps over the substrate, first and second light emitting units between the bumps and over the substrate, and a metal-containing layer over the first electron transportation layers of the first and second light emitting units. Each of the first and second light emitting units includes a first electrode and an organic emissive layer over the first electrode; and a first electron transportation layer over the organic emissive layer, wherein the first electron transportation layer includes transition metal or alkali metal. Each of the first and second light emitting units includes a first meeting point and a second meeting point. One end of the each first electron transportation layer meets the corresponding organic emissive layer and the metal-containing layer at the first meeting point. Each organic emissive layer has an end close to the corresponding first meeting point, and the end of each organic emissive layer meets the metal-containing layer at the second meeting point. The second meeting point is spaced apart from the corresponding first meeting point and away from the corresponding organic emissive layer. The distance between the first meeting point of the first light emitting unit and the second meeting point of the first light emitting unit is different from the distance between the first meeting point of the second light emitting unit and the second meeting point of the second light emitting unit.

BRIEF DESCRIPTION OF THE DRAWINGS

FIGS. 15A-15F illustrate a method of manufacturing a light emitting device according to an embodiment.

DETAILED DESCRIPTION OF THE DISCLOSURE

The present disclosure provides a light emitting device, especially, organic light emitting device (OLED), and a method of manufacturing thereof. In the present disclosure, an organic light emitting layer in the OLED is formed by photo lithography. In some embodiments, the organic light emitting layer is a polymer light emitting layer. In some embodiments, the organic light emitting layer includes several light emitting pixels.

Figure 1:
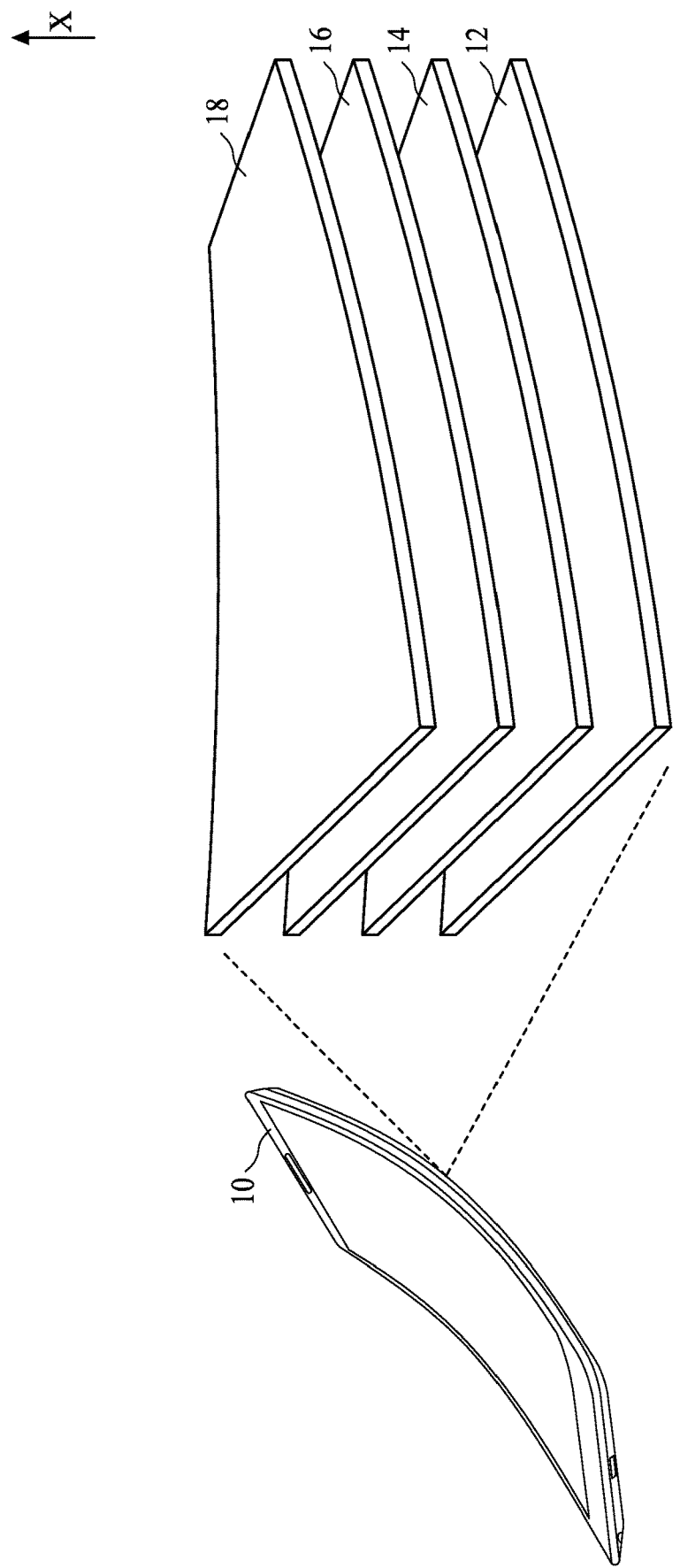
FIG. 1 is a flexible light emitting device.

FIG. 1 illustrates an embodiment of an electronic device 10. The electronic device 10 can be a rigid or a flexible display. Display 10 can have at least four different layers substantially stacked along a thickness direction X. Layer 12 is a substrate configured as a platform to have a light emitting layer 14 disposed thereon. Layer 16 is a cap layer to be disposed on the light emitting layer 14 and layer 18 is configured as a window for light emitting in/out the electronic device 10. In some embodiments, layer 16 is an encapsulation layer. Layer 18 can also be configured as a touch interface for the user, therefore the surface hardness of the might be high enough to meet the design requirement. In some embodiments, layer 16 and layer 18 are integrated into one layer.

Layer 12 might be formed with a polymer matrix material. Layer 12 has a bend radius being not greater than about 3 mm. In some embodiments, layer 12 has a minimum bend radius being not greater than 10 mm. The minimum bend radius is measured to the inside curvature, is the minimum radius one can bend layer 12 without kinking it, damaging it, or shortening its life. In some embodiments, several conductive traces may be disposed in layer 12 and form circuitry to provide current to the light emitting layer 14. In some embodiments, layer 12 includes graphene.

Figure 2:
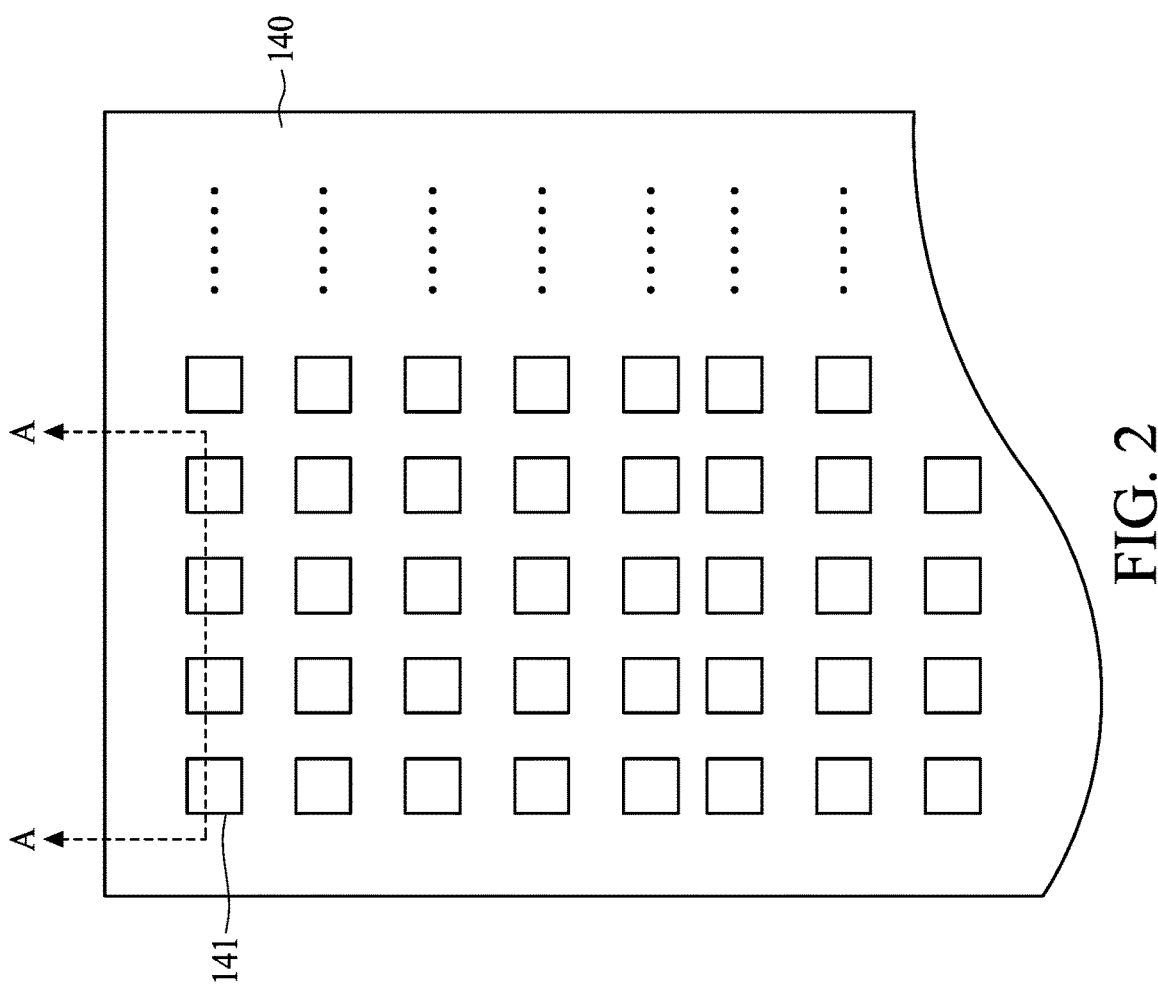
FIG. 2 is top view of a portion of a flexible light emitting device according to an embodiment.
Figure 3:
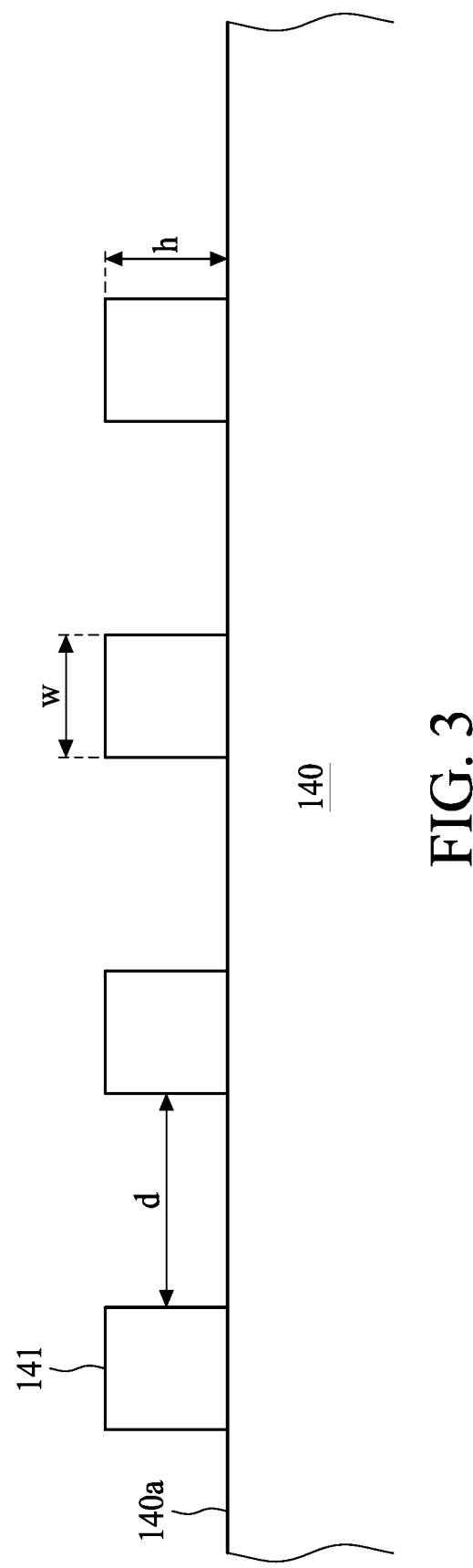
FIG. 3 is cross sectional view of a portion of a flexible light emitting device according to an embodiment.

Light emitting layer 14, can be configured as an array, as shown in FIG. 2, including many light emitting units. A cross sectional view of along ling AA is illustrated in FIG. 3. In some embodiments, the layer 14 has a substrate 140. In some embodiments, the substrate is configured to be able to provide current to the light emitting units. In some embodiments, the light emitting units 141 are configured as mesa disposed on the substrate 140. In some embodiments, the light emitting units are configured to be in recesses of the substrate 140. A thickness "h" of the light emitting units may range from about −100 um to about 100 um. The thickness h is measured from the surface 140a of the substrate 140. The negative value means the light emitting unit is disposed in the recess. Positive means light emitting unit protrudes like mesa shown in FIG. 3. The light emitting units can be arranged in an array. Each independent light emitting unit is separated from other adjacent light emitting units. A gap, d, represents a separation distance between two adjacent light emitting units. In some embodiments, gap, d, is between about 2 nm and about 100 um. In some embodiments, the gap, d, is controlled to be at least not greater than about 50 um so that the density of the units can be designed to be at least more than 700 ppi or 1200 ppi.

In some embodiments, a light emitting unit has a width, w, being between about 2 nm and about 500 um. The light emitting unit is a polymeric material. In some embodiments, the light emitting unit is photo sensitive. In some embodiments the width, w, is not greater than about 2 um.

Figure 4:
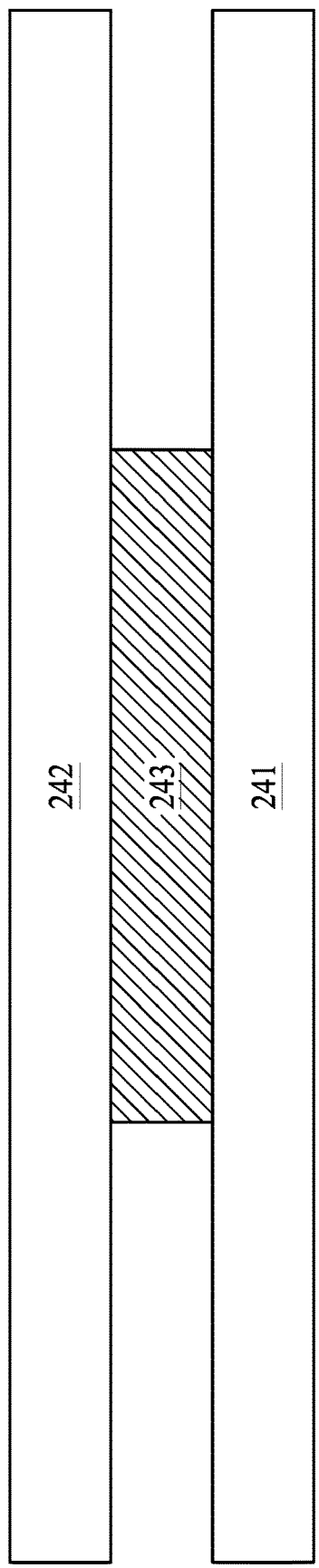
FIG. 4 is cross sectional view of a portion of a flexible light emitting device according to an embodiment.

FIG. 4 illustrates an embodiment of a light emitting pixel 24 in a light emitting layer from a crossectional view perspective. The light emitting pixel 24 includes a light emitting unit 243 as the light emitting unit in FIG. 3. Further, the light emitting pixel 24 includes a first type carrier transportation layer 241 and a second type carrier transportation layer 242. The first type is opposite to the second type. In some embodiments, the first type transportation layer 241 is a hole transportation layer (HTL) and the second type carrier transportation layer 242 is an electron transportation layer (ETL). In some embodiments, the first type transportation layer 241 is an electron transportation layer (ETL) and the second type carrier transportation layer 242 is a hole transportation layer (HTL).

In some embodiments, trace of metal is found in the first type carrier transportation layer 241 or the second type carrier transportation layer 242. Moreover, metal element may appear first type carrier transportation layer 241 or the second type carrier transportation layer 242. The metal element includes transition metal. In some embodiments, the metal element includes at one of the elements, Y, Zr, Nb, Mo, Ru, Rh, Cd, Hf, Ta, W, Re, Os.

In some embodiments, the light emitting unit 243 is in contact with the first type transportation layer 241. In some embodiments, the light emitting unit 243 is in contact with the second type transportation layer 242. In some embodiments, an intermediate layer is between the light emitting unit 243 and the first type transportation layer 241. In some embodiments, an intermediate layer is between the light emitting unit 243 and the second type transportation layer 242.

Figure 5:
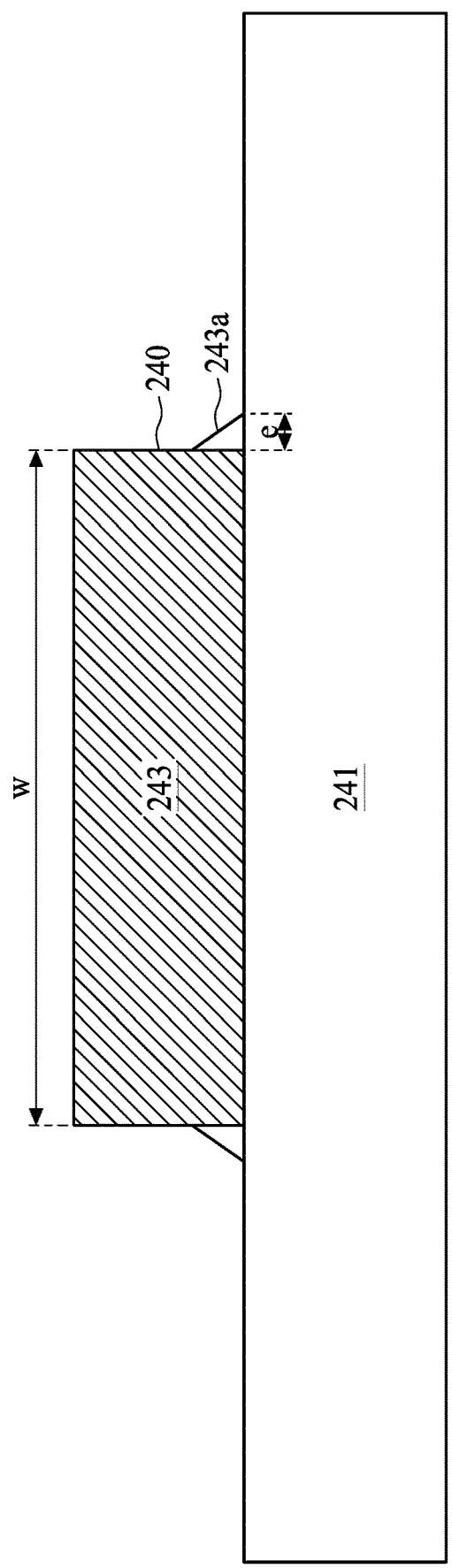
FIG. 5 is cross sectional view of a portion of a flexible light emitting device according to an embodiment.

FIG. 5 is an enlarged view of the light emitting unit 243 in FIG. 4 in according to some embodiments. The light emitting unit 243 has a footing 243a extended laterally from the sidewall 240 of the light emitting unit 243. The footing 243a is in contact with the first type transportation layer 241. The lateral extension of the footing 243a has a width, e, which is measured from the sidewall 240 to the tip of the footing 243a. The tip is farthest point where the footing 243a can extend. The tip is also the end point where the footing meets the first type transportation layer 241.

Figure 6:
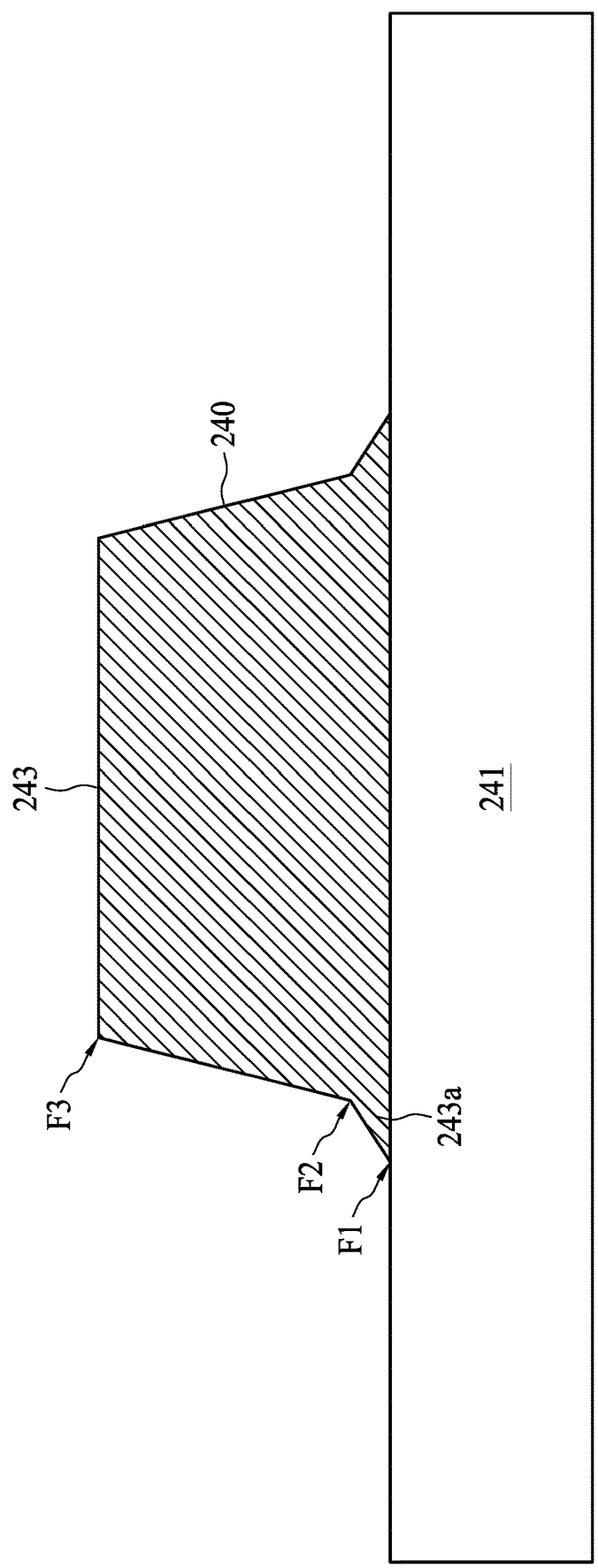
FIG. 6 is cross sectional view of a portion of a flexible light emitting device according to an embodiment.
Figure 7:
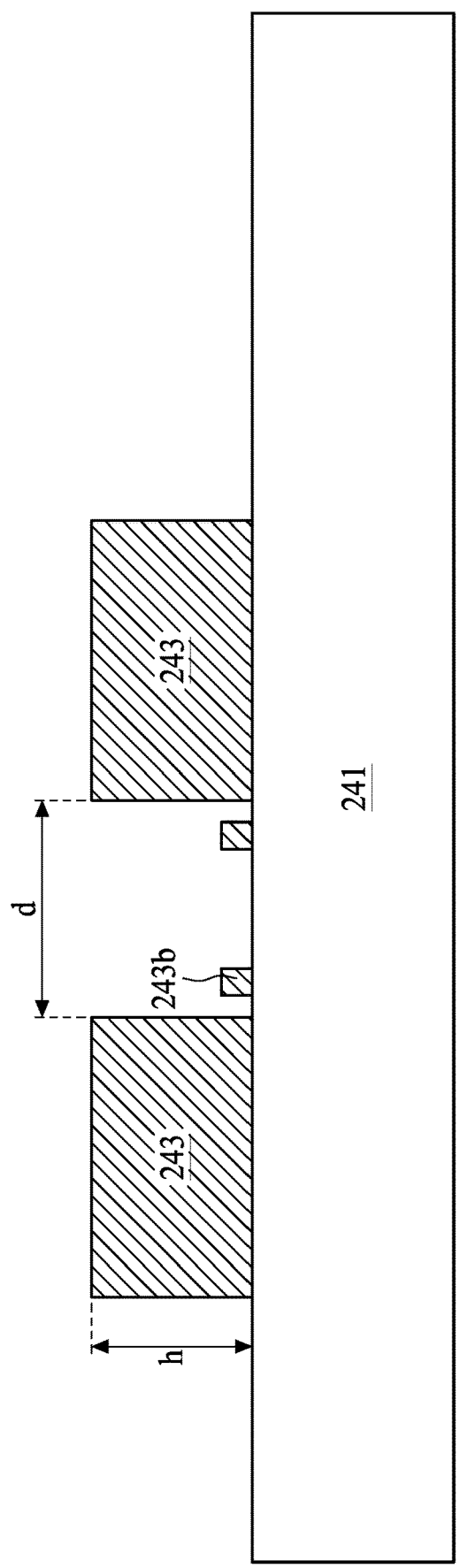
FIG. 7 is cross sectional view of a portion of a flexible light emitting device according to an embodiment.

FIG. 6 illustrates another embodiment of a light emitting unit 243 in FIG. 4. The sidewall 240 of the light emitting unit is tapered and has two different slopes. The first slope is measured from the tip F1 of the footing 243a to the turning point F2. The second slope is measured from the turning point F2 to the top corner F3 of the light emitting unit 243. In some embodiments, the second slope is greater than the first slope.

One of the purposes to have a footing 243a extended from the bottom of the light emitting unit 243 is to increase the adhesion between the light emitting unit 243 and the first type transportation layer 241. Because the light emitting unit 243 and the first type transportation layer 241 may be formed with different materials, the surface tension between the light emitting unit 243 and the first type transportation layer 241 may cause undesired peeling. With the footing 243a, the contact surface between the light emitting unit 243 and the first type transportation layer 241 is increased to secure the light emitting unit 243 sitting on the first type transportation layer 241

In some embodiments, there are some secondary light emitting unit 243b disposed between two adjacent light emitting unit 243. The secondary light emitting unit 243b has a height that is smaller than the height, h, of the light emitting unit 243. The secondary light emitting unit 243b is isolated from the light emitting unit 243. In some embodiments, the height of the secondary light emitting unit 243b is about ⅕ to about 1/15 of the height of the light emitting unit 243.

In some embodiments, the light emitting unit 243 and an adjacent secondary light emitting unit 243b emit a light with a same wavelength. In some embodiments, some light emitting units are designed to emit a light with a first wavelength. Some light emitting units are designed to emit a light with a second wavelength, which is different from the first wavelength. Some light emitting units are designed to emit a light with a third wavelength, which is different from the first wavelength and the second wavelength. One light emitting unit may be assigned to have a secondary light emitting unit disposed adjacent to the light emitting unit and the assigned secondary light emitting unit emits a light with the same wavelength as the corresponding light emitting unit.

Figure 8:
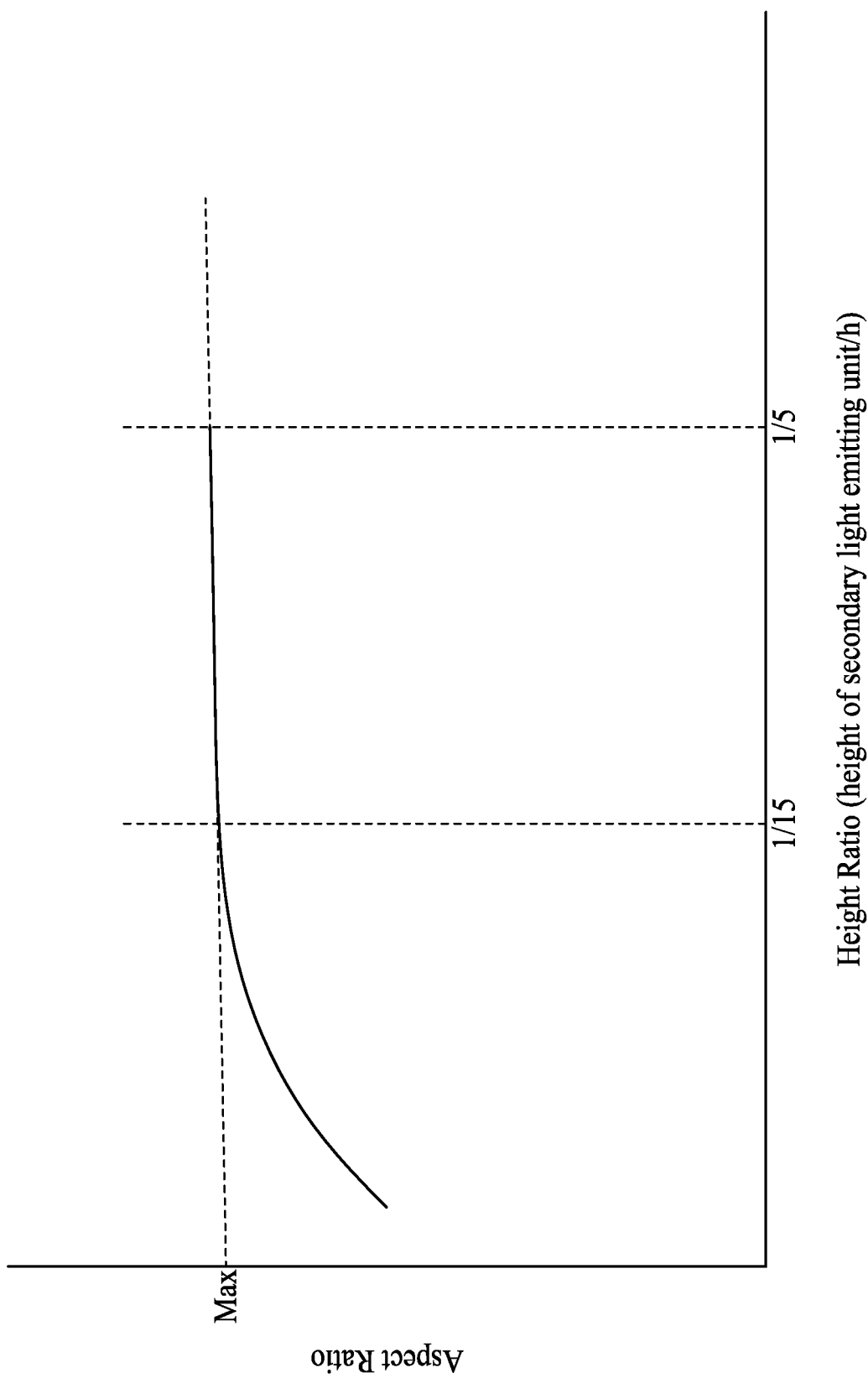
FIG. 8 illustrates a correlation between the aspect ratio and height ratio.

Aspect ratio of light emitting unit 243 is defined as the height h of the light emitting unit 243 divided by the gap, d, between two adjacent light emitting units. As shown in FIG. 8, when the height ratio between the secondary light emitting unit 243b and the light emitting unit 243 reaches 1/15, the aspect ratio start entering into a saturation zone until the height ratio reaches ⅕. For an ultra-high PPI (>1200 ppi) display, the designer can adjust the height ratio between the secondary light emitting unit 243b and the light emitting unit 243 in order to meet the requirement of the aspect ratio.

Figure 9:
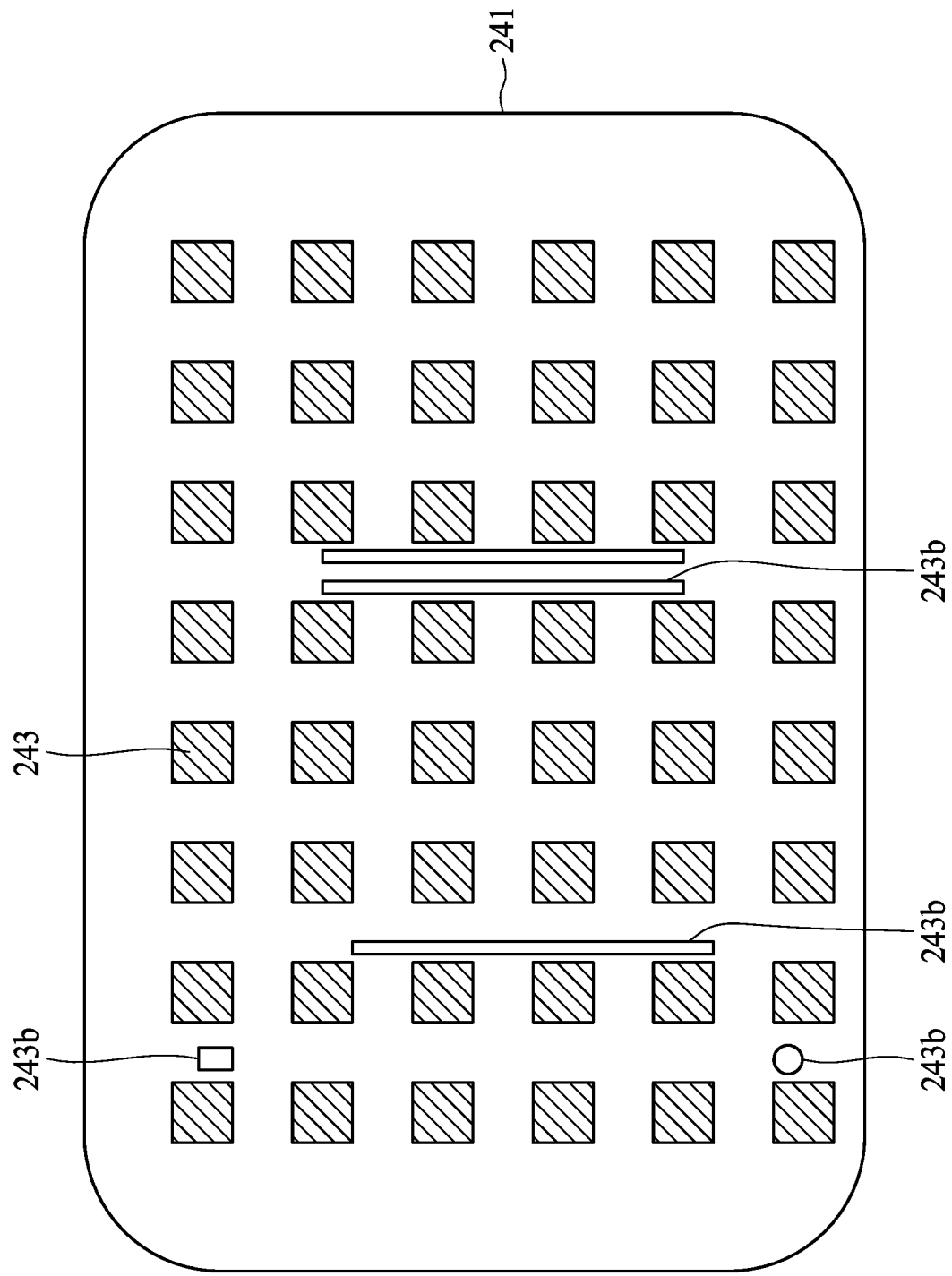
FIG. 9 is top view of a portion of a flexible light emitting device according to an embodiment.

FIG. 9 is a top view of an embodiment of an array of light emitting unit 243 disposed on a first type transportation layer 241. The secondary light emitting unit 243b can be formed as in quadrilateral, circle, or a strip shape.

In some embodiments, a secondary light emitting unit 243b is formed to be in corresponding to only one pair of light emitting units 243. The secondary light emitting unit 243b is designed to improve the aspect ratio of the gap between of the pair of light emitting units 243. In some embodiments, a circular shaped secondary light emitting unit 243b may increase the maximum aspect ratio (Max in FIG. 8) to be 10% to 15% higher than a quadrilateral one.

In some embodiments, a secondary light emitting unit 243b is formed to be in corresponding to several pairs of light emitting units 243. Like the one in a strip pattern at left side, the strip-like secondary light emitting unit 243b is designed to be corresponding to at least three different pairs of light emitting units 243.

In some embodiments, there are at least two separate secondary light emitting units 243b formed to be in corresponding to several pairs of light emitting units 243. As the two strip-like light emitting units 243b at the right side, there are two secondary light emitting strips in parallel.

Figure 10:
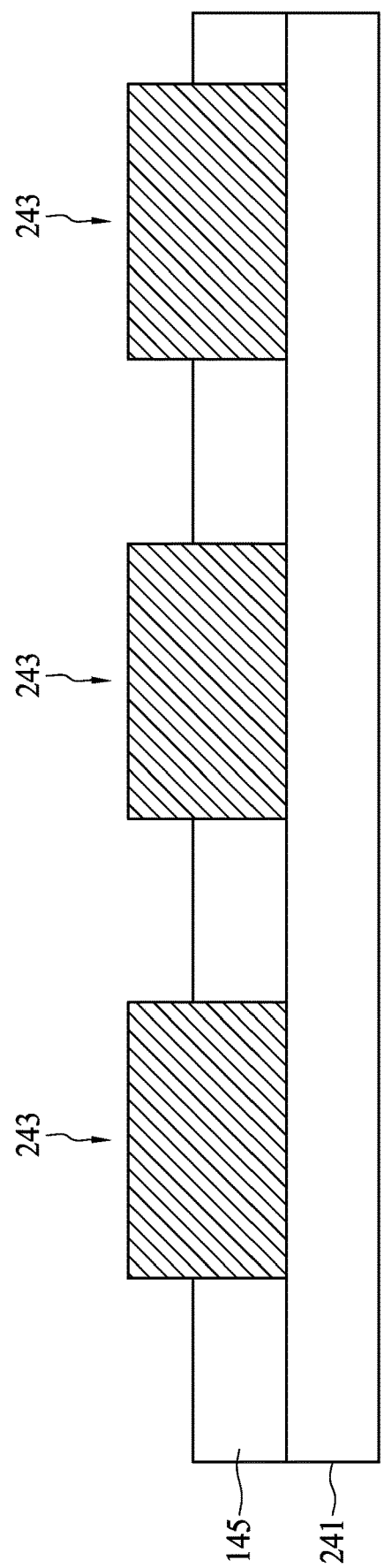
FIG. 10 is a cross sectional view of a portion of a flexible light emitting device according to an embodiment.

In order to minimize the interference between adjacent light emitting units 243, an absorption material 145 can be used to fill the gaps between light emitting units 243 as shown in FIG. 10. The absorption material 145 can absorb the light emitted from the light emitting units 243 and any visible light entering into the device from ambient.

Figure 11:
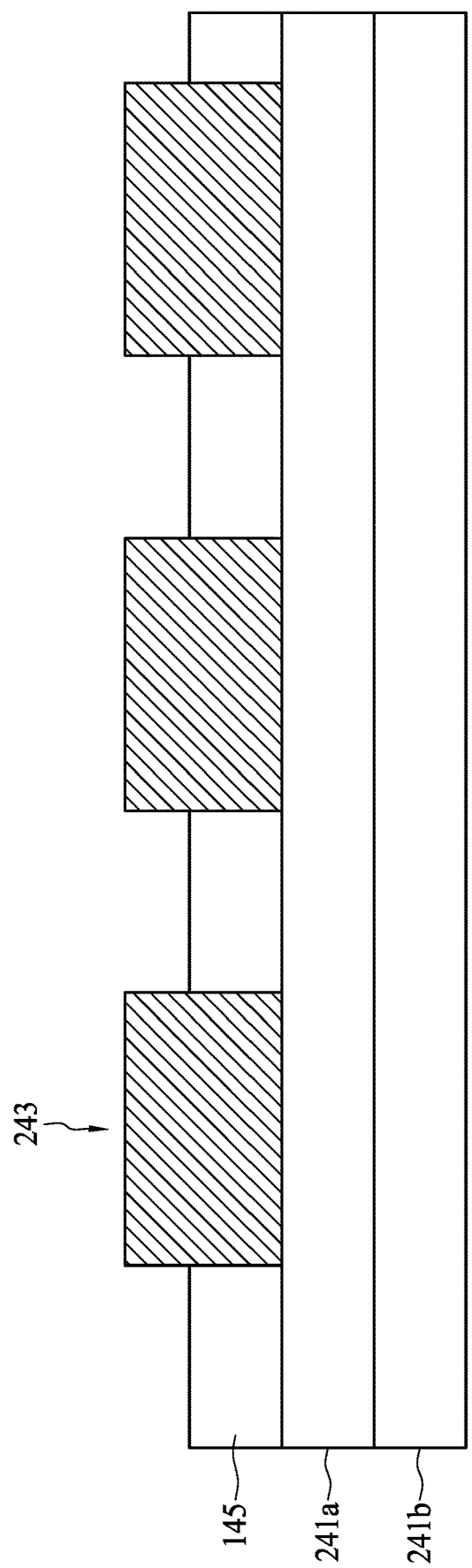
FIG. 11 is a cross sectional view of a portion of a flexible light emitting device according to an embodiment.

In some embodiments, the first type carrier transportation layer 241 is a composite structure and includes at least a primary layer 241a and a secondary transportation layer 241b as in FIG. 11. The trace of metal is found in any one sub-layer of the first type carrier transportation layer 241. The metal element includes transition metal. In some embodiments, the metal element includes at one of the elements, Y, Zr, Nb, Mo, Ru, Rh, Cd, Hf, Ta, W, Re, Os.

Similarly, in some embodiments, the second type carrier transportation layer 242 is a composite structure and includes at least a primary layer and a secondary transportation layer. The trace of metal is found in any one sub-layer of the second type carrier transportation layer 242. The metal element includes transition metal. In some embodiments, the metal element includes at one of the elements, Y, Zr, Nb, Mo, Ru, Rh, Cd, Hf, Ta, W, Re, Os. In some embodiments, layer 606 or 306 may include Cs, Rb, K, Na, Li, Yb, Lu, Tm, etc.

Figure 12:
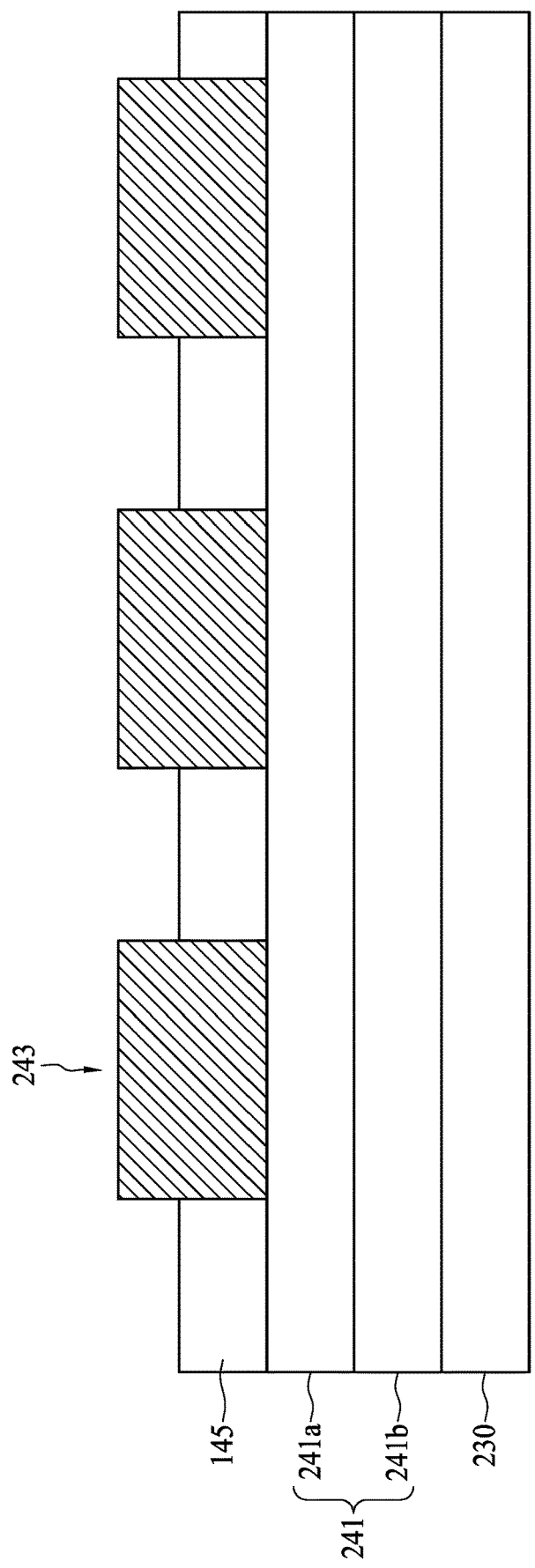
FIG. 12 is a cross sectional view of a portion of a flexible light emitting device according to an embodiment.

In some embodiments, there is a first type carrier injection layer adjacent to the first type carrier transportation layer. As in FIG. 12, the first type carrier injection layer 230 is adjacent to the first type carrier transportation layer 241. Similarly, there is a second type carrier injection layer adjacent to the second type carrier transportation layer.

Figure 13A:
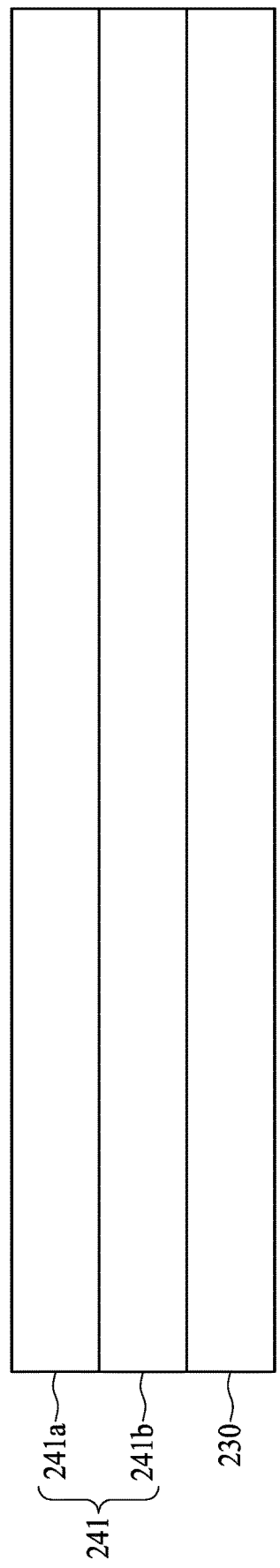
FIGS. 13A-13E illustrate an operation of manufacturing a flexible light emitting device according to an embodiment.
Figure 13B:
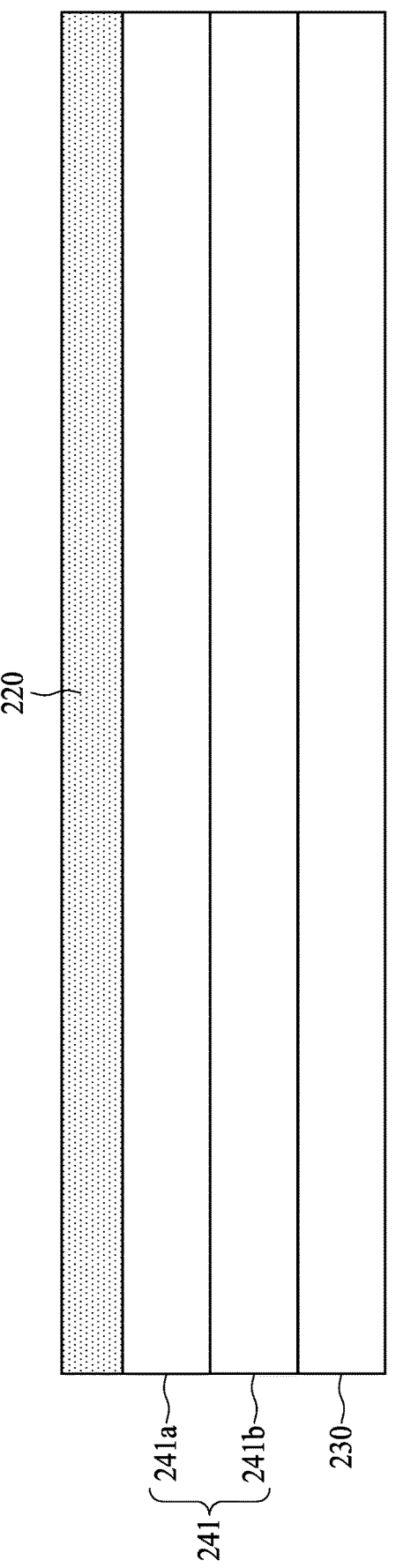
Figure 13C:
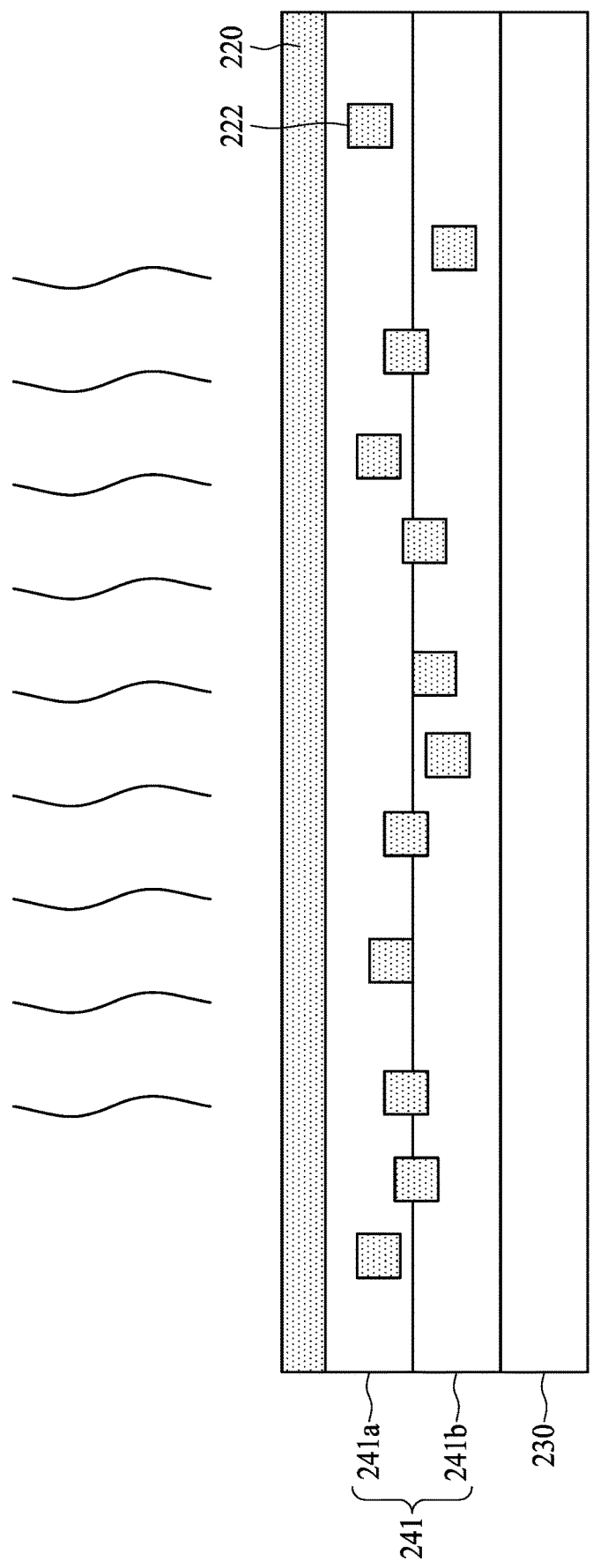

FIG. 13A-13C illustrate some operations of manufacturing a light emitting device. In FIG. 13A, a substrate including a first type carrier injection layer 230 and a composite first type carrier transportation layer is provided.

In FIG. 13B, a metal or metal complex layer 220 is disposed on the composite first type carrier transportation layer. The metal complex layer can be formed by various deposition processes such as, vapor deposition, sputtering, atomic layer deposition (ALD), heat evaporation, coating, or jetting. In some embodiments, the thickness of layer 220 is about 30 Å or less. Layer 220 may include oxygen, nitrogen, argon, fluorine, carbon, etc.

A treatment process is introduced in FIG. 13C. The treatment process can be performed by heating, microwave, plasma treatment. The treatment is applied directly on layer 220. During the treatment, layer 220 is broken down such that transitional metal element 222 in layer 220 can penetrate into the first type carrier transportation layer 241. In some embodiments, the distribution of the transitional metal element 222 may have a gradient. In some embodiments, a density of the transitional metal element 222 at the top surface of the first type carrier transportation layer 241 is higher than a density at a location proximal to the interface between first type carrier transportation layer 241 and the first type carrier injection layer 230. Similarly, the above metal diffusion operation can be applied to the second type carrier transportation layer.

Figure 13D:
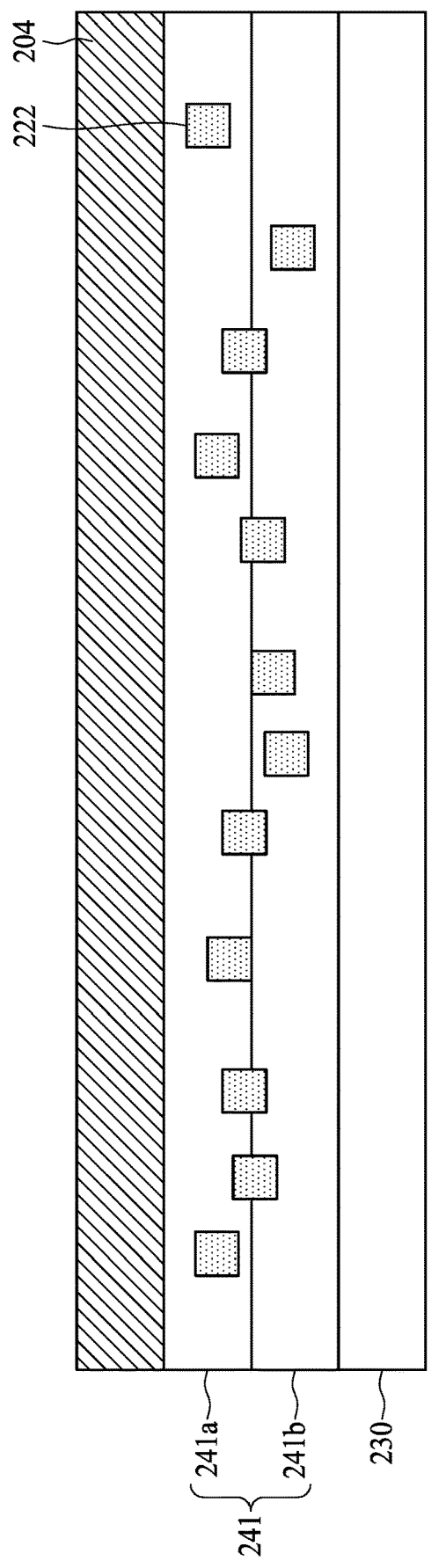

After the treatment, the layer 220 may disappear or be removed from the surface of the first type carrier transportation layer 241. A photo sensitive organic light emitting layer 204 is disposed over the first type carrier transportation layer 241 after the treatment or removal process as in FIG. 13D.

Figure 13E:
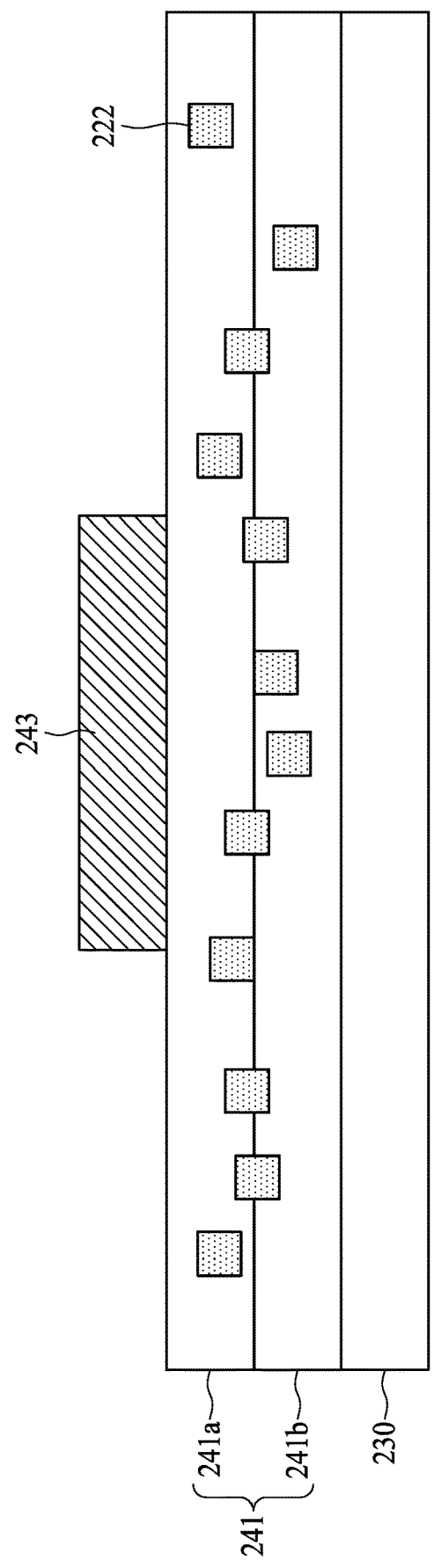

In FIG. 13E, a patterning process, such as photolithography, is introduced to remove excessive portion and form a light emitting unit 243. In some embodiments, unlike the operation in FIG. 13B, the metal or metal complex layer 220 is not disposed before forming the light emitting unit 243. In one example, a light emitting unit 243 is formed over the first type carrier transportation layer 241. After forming the light emitting unit 243, the metal or metal complex layer 220 is disposed on the light emitting unit 243. After forming the metal or metal complex layer 220, a treatment is optionally selected to treat the metal or metal complex layer 220. In some embodiments, a second type carrier transportation layer is disposed over the light emitting unit 243 and the metal or metal complex layer 220. In some embodiments, a light emitting unit 243 is formed over the first type carrier transportation layer 241. After forming the light emitting unit 243, a second type carrier transportation layer is disposed over the light emitting unit 243. After forming the second type carrier transportation layer, the metal or metal complex layer 220 is disposed on or over the second type carrier transportation layer. A treatment is optionally selected to be introduced to the metal or metal complex layer 220.

Figure 14A:
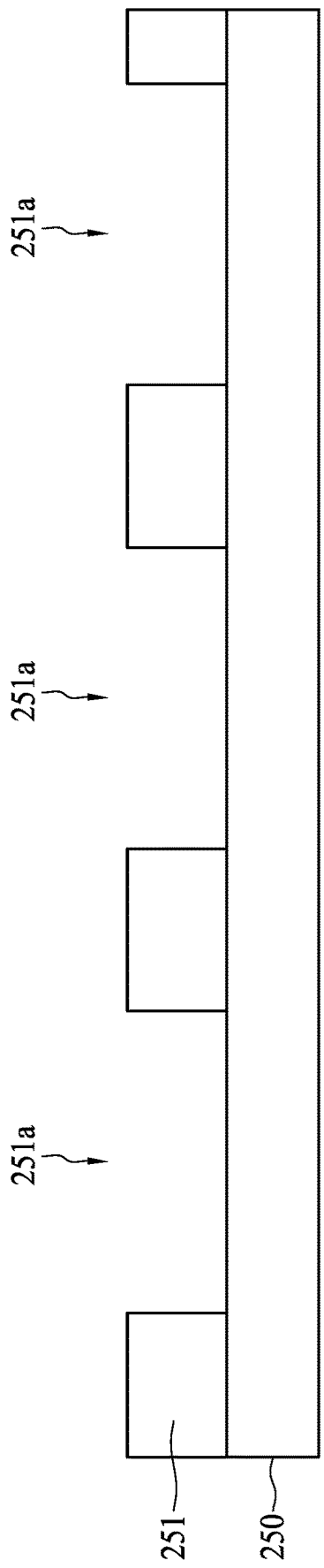
FIGS. 14A-14D illustrate a method of manufacturing a light emitting device according to an embodiment.

FIG. 14A-FIG. 14D illustrate another embodiment to form light emitting units 243 on a substrate 250. In some embodiments, the substrate 250 includes a carrier transportation layer. In some embodiments, the substrate 250 includes a TFT (thin film transistor) array. In FIG. 14A, a patterned photosensitive layer 251 is formed on the substrate 250. In some embodiments, the patterned photosensitive layer 251 is a photo absorption material as the photo absorption material 145 in FIG. 10. In some embodiments, the patterned photosensitive layer 251 is used as a pattern defined layer. A region 251a is defined by two adjacent patterned photosensitive mesas and the region 251a is configured to receive an organic light emitting unit. In some embodiments, the patterned photosensitive layer 251 is fluorine free, i.e. substantially contains no fluorine.

Figure 14B:
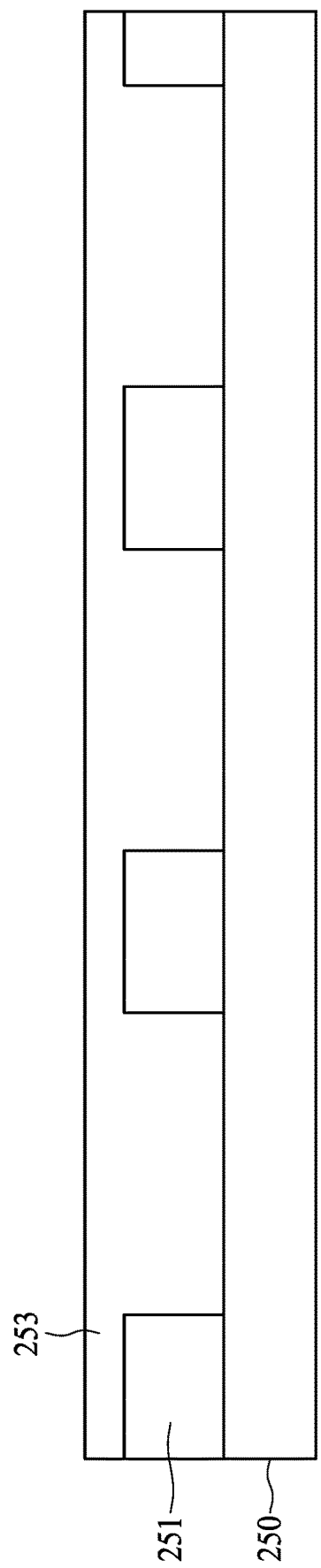
Figure 14C:
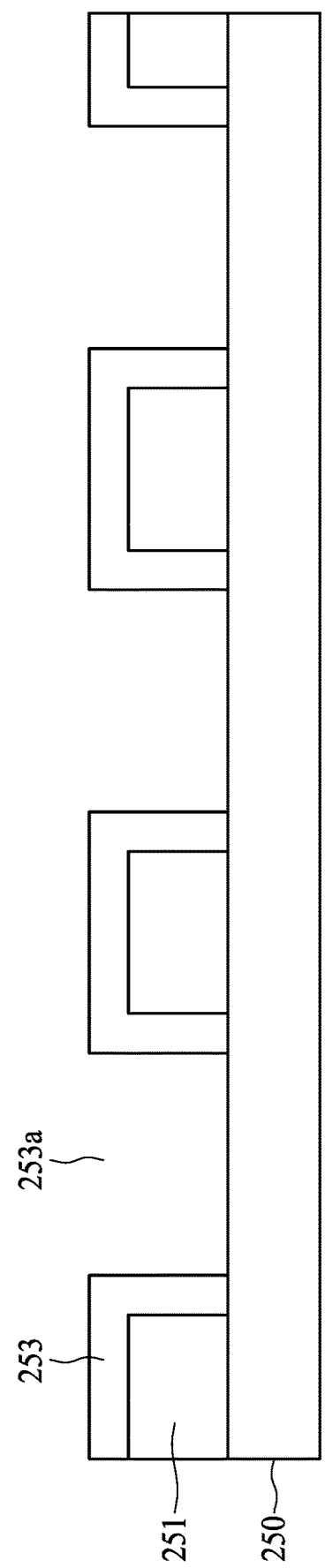
Figure 14D:
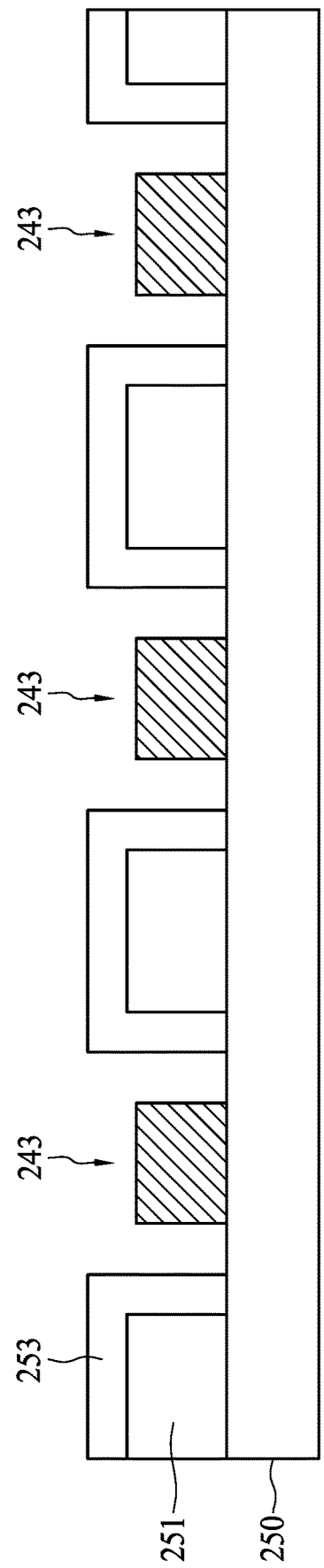

In FIG. 14B, a photo resist layer 253 is disposed over the photosensitive layer 251 and in the region 251a. In some embodiments, the photo resist layer 253 contains fluorine. In FIG. 14C, the photo resist layer 253 is patterned to have openings 253a. In some embodiments, each opening 253a has a width less than about 10 um. In FIG. 14D, an organic light emitting unit 243 is formed in the opening 253a. In some embodiments, the organic light emitting unit 243 has a height that is smaller than a height of the photosensitive layer 251. The photo resist layer 253 can be removed in another step (not shown in the drawings).

Figure 15A:
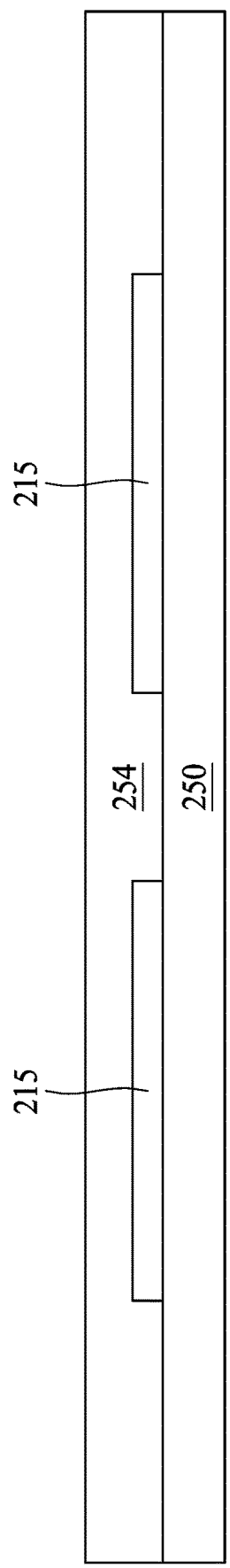

In FIG. 15A, a substrate 250 is provided, the substrate 250 may include a TFT (thin film transistor) array. Several first electrode 215 are disposed over the substrate 250. Each first electrode 215 is configured to be connected to a circuit embedded in the substrate 250 at one side and to be in contact with a light emitting material at the other side. The pattern of the first electrode array is designed for the pixel arrangement. A photosensitive layer 254 is disposed over the first electrodes 215 and the substrate 250. In some embodiments, the photosensitive layer 254 is spin-coated over the first electrodes 215 and the substrate 250.

Figure 15B:
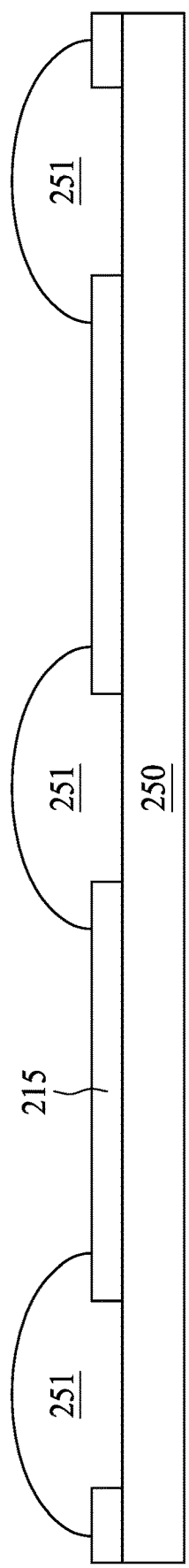

The photosensitive layer 254 fills into the gap between adjacent first electrodes. The photosensitive layer 254 is heated to a predetermined temperature then exposed under a designated wavelength. The photosensitive layer 254 may absorb over 90% of the visible light and is also called black material in the present disclosure. After exposure, the photosensitive layer 254 is rinsed in a solution for development. A portion of the photosensitive layer 254 is removed and the remaining portion is substantially covering the gap between adjacent first electrodes as shown in FIG. 15B. In the cross sectional view, the remaining photosensitive layer 254 form several bumps 251, each bump 251 fills the gap of two adjacent first electrodes. Each first electrode 215 is partially covered by the bump 251. The patterned bumps 251 are also called pixel defined layer (PDL).

The bump 251 can be formed in different types of shape. In FIG. 15B, the bump 251 has a curved surface. In some embodiments, the shape of bump 251 is tapezoid. After the bumps 251 formed, a cleaning operation is performed to clean the exposed surfaces of the bumps 251 and the first electrodes 215. In one embodiment, during the cleaing operation, a DI (De-Ionized) water is heated to a tempature between 30 C and 80 C. After the temperture of DI water is elevated to a predetermined temperature then is introduced to the exposed surfaces of the bumps 251 and the first electrodes 215.

In some embodiments, ultrsonic is used during the cleaning operation. The ultrasoic is introduced into the cleaning agent, such as water or IPA, etc. In some embodiments, carbon dioxide is introduced into the cleaning agent. After the cleaning operation, the cleaning agent is removed from the exposed surfaces via a heating operation. During the heating operation, the substrate 250 and the bump 251 may be heated to a temperature between about 80 C and 110 C. In some cases, an compressed air is introduced to the exposed surfaces to help remove the residue of clean agent while heating.

After the heating operation, the exposed surfaces may be treated with an $O_2$, $N_2$, or Ar plasma. The plasma is used to roughened the exposed surfaces. In some embodiments, an ozone gas is used to adjust the surface condition of the exposed surfaces.

Figure 15C:
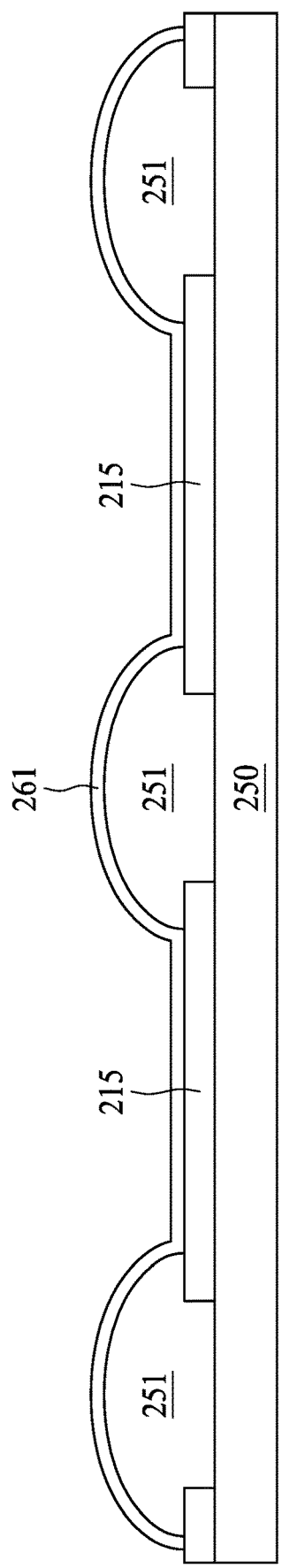

A carrier injection layer 261 is disposed over the exposed surfaces of the bumps 251 and the first electrodes 215 as in FIG. 15C. The carrier injection layer 261 is continuously lining along the exposed surfaces. More specifically, the exposed surface of each first electrode 215 is configured as an effective light emitting area for one light emitting unit. In this embodiment, all light emitting units use a common carrier injection layer 261. In some embodiments, the light emitting units are configured into at least three different groups and each group emits a color different than the others. Two of the at least three different groups use a common carrier injection layer 261 and the carrier injection layer 261 for the other one group is not common to the other two groups. In some embodiments, the red group and green group light emitting units use a common carrier transportation layer 262, and the blue group light emitting units uses a carrier transportation layer 262 independent from the common carrier transportation layer 262. In some embodiments, layer 261 is for hole injection. In some embodiments, layer 261 is for electron injection. The carrier injection layer 261 continuously overlies several PDL bumps 251 and first electrodes 215. Optionally, the carrier injection layer 261 is in contact with the PDL bumps 251. In one embodiment, the carrier injection layer 261 is in contact with the first electrodes 215. In some embodiments, the carrier injection layer 261 is organic.

Figure 15D:
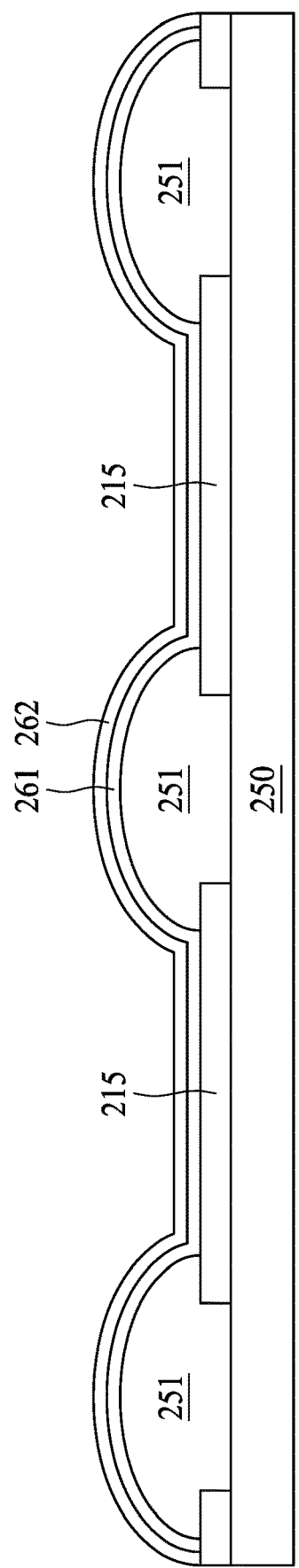

A carrier transportation layer 262 (or called first type carrier transportation layer) is disposed over the exposed surfaces of the bumps 251 and the first electrodes 215 as in FIG. 15D. The carrier injection layer 261 is disposed under the carrier transportation layer 262. The carrier transportation layer 262 is continuously lining along the carrier transportation layer 262. In this embodiment, all light emitting units use a common carrier transportation layer 262. In some embodiments, the light emitting units are configured into at least three different groups and each group emits a color different than the others. Two of the at least three different groups use a common carrier transportation layer 262 and the carrier transportation layer 262 for the other one group is not common to the other two groups. In some embodiments, the red group and green group light emitting units use a common carrier transportation layer 262, and the blue group light emitting units uses a carrier transportation layer 262 independent from the common carrier transportation layer 262. In some embodiments, layer 262 is for hole transportation. In some embodiments, layer 262 is for electron transportation. The carrier transportation layer 262 continuously overlies several PDL bumps 251 and first electrodes 215. Optionally, the carrier transportation layer 262 is in contact with the carrier injection layer 261. In some embodiments, the carrier transportation layer 262 is organic.

Figure 15E:
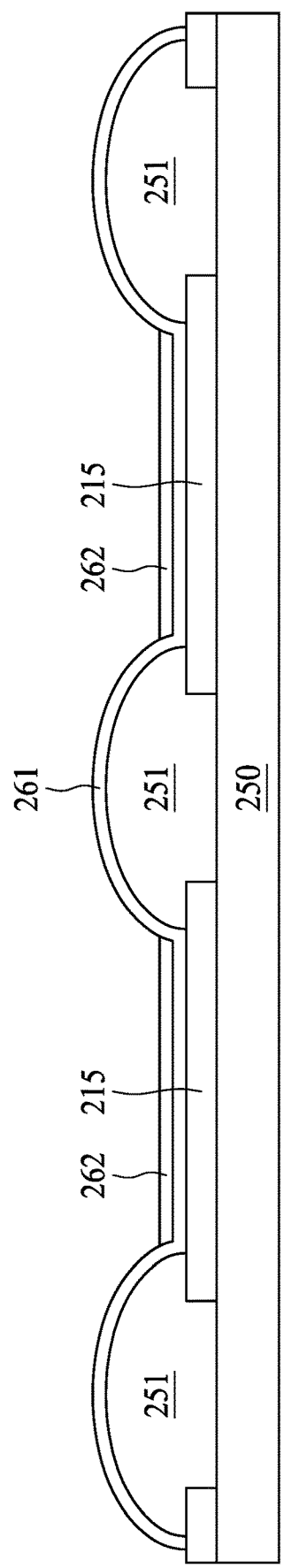

In some embodiments, the carrier transportation layer 262 is configured to be broken into segements and the carrier injection layer 261 is continuously lining along the exposed PDL bumps and first electrodes as shown in FIG. 15E. Each segment is vertically aligned to a first electrode 215. In other words, the carrier transportation layer 262 is not continuously lining along the carrier injection layer 261. Each light emitting unit has a separate carrier transportation layer disposed thereon.

In some embodiments, the carrier injection layer 261 is configured to be broken into segements and the carrier transportation layer 262 is continuously lining along the exposed PDL bumps and the segmented carrier injection layer 261 as shown in FIG. 15F. Each segment is vertically aligned to a first electrode 215. In other words, the carrier injection layer 261 is not continuously lining along the exposed bumps 251 and first electrode 215. Each light emitting unit has a separate carrier injection layer 261 disposed thereon.

Figure 16A:
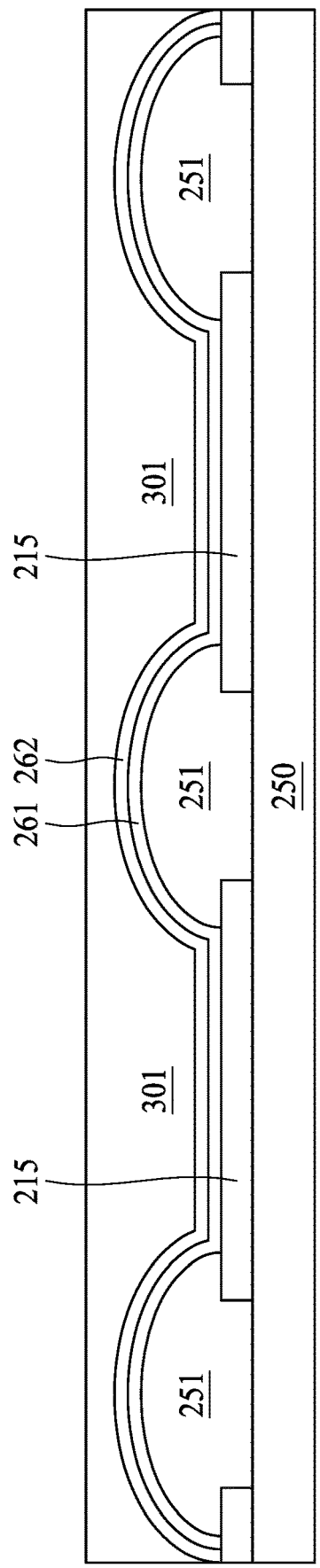
FIGS. 16A-16G illustrate a method of manufacturing a light emitting device according to an embodiment.

A buffer layer 301 is disposed over the PDL bumps 251 and also covers the carrier injection layer 261 and carrier transportation layer 262, as shown in FIG. 16A. The buffer layer 301 is used to block moisture penetrating into the PDL bumps 251, and the carrier injection layer 261 and carrier transportation layer 262. In one embodiment, the buffer 301 is disposed by spin coating. The buffer layer 301 can be further heated to a temperature $T_1$. In some embodiments, $T_1$ is about 5 C to 10 C below the glass temperature of the carrier injection layer 261 and carrier transportation layer 262. The heating operation is about 1 to 10 minutes. In some embodiments, the buffer layer 301 includes fluorine.

Figure 16B:
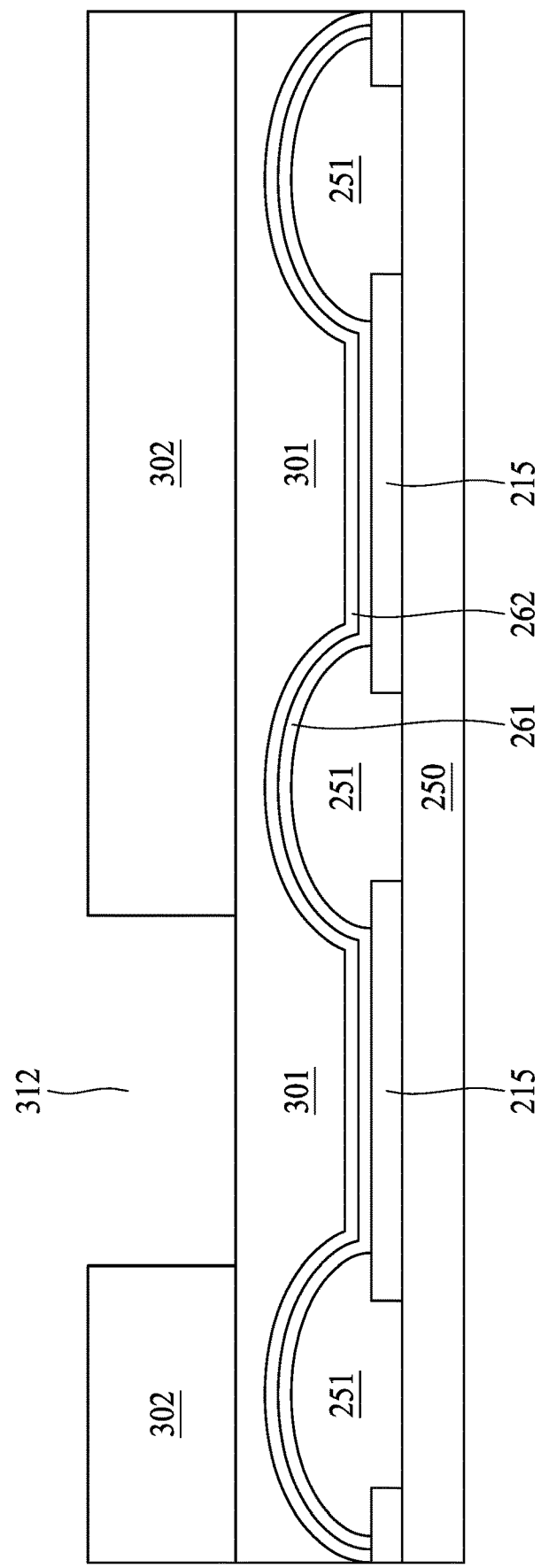
Figure 16C:
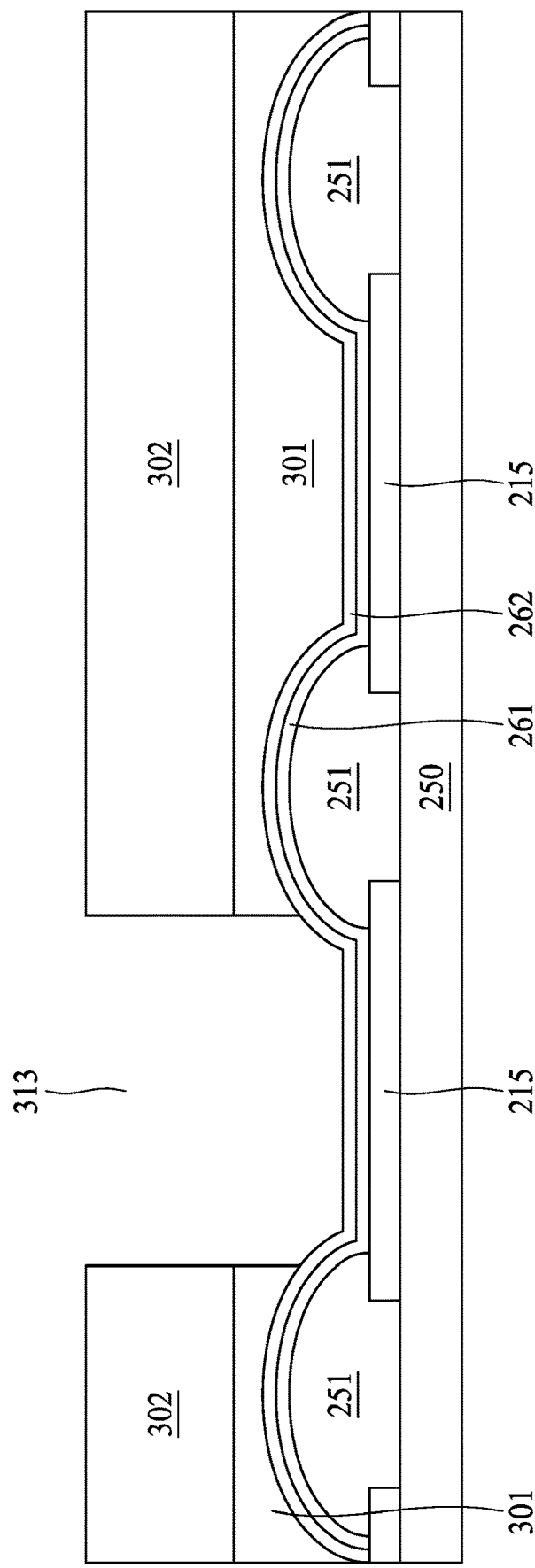

In FIG. 16B, a photosensitive layer 302 is disposed over the buffer layer 301 after the heating operation. The photosensitive layer 302 is further patterned by a lithography process to expose a portion of buffer layer 301 through the recess 312. In FIG. 16C, a portion of the buffer layer 301 is removed to have a recess 313 to expose the carrier transportation layer 262. In some embodiments, the removal operation in FIG. 16C is performed by wet etch.

Figure 16D:
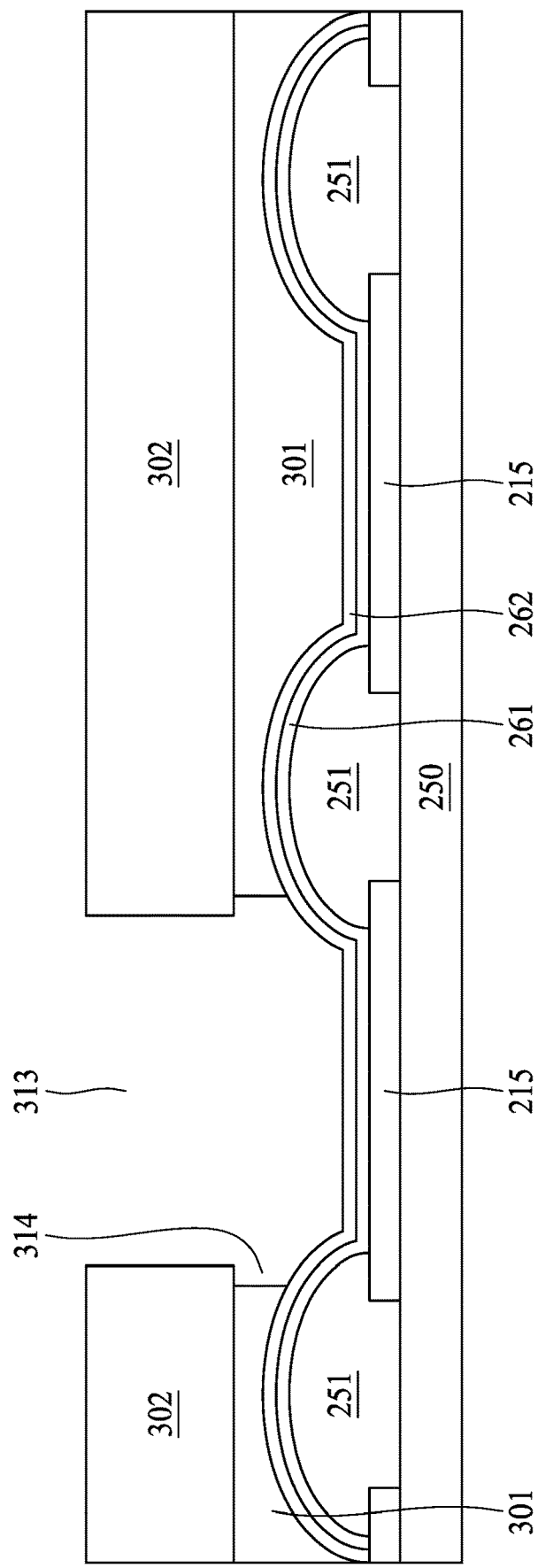

For some embodiments, the removal operation includes at least two steps. The first step is vertical removal and the buffer layer 301 is carved out substantially following the dimention of opening width of the recess 312 as shown in FIG. 16C. After forming the recess 313, a second step is introduced to perform a lateral removal as shown in FIG. 16D. An undercut 314 is formed to expand the recess 313 further into the buffer layer 301 in order to expose more surfaces toward the topmost point of the PDL bump 251.

Figure 16E:
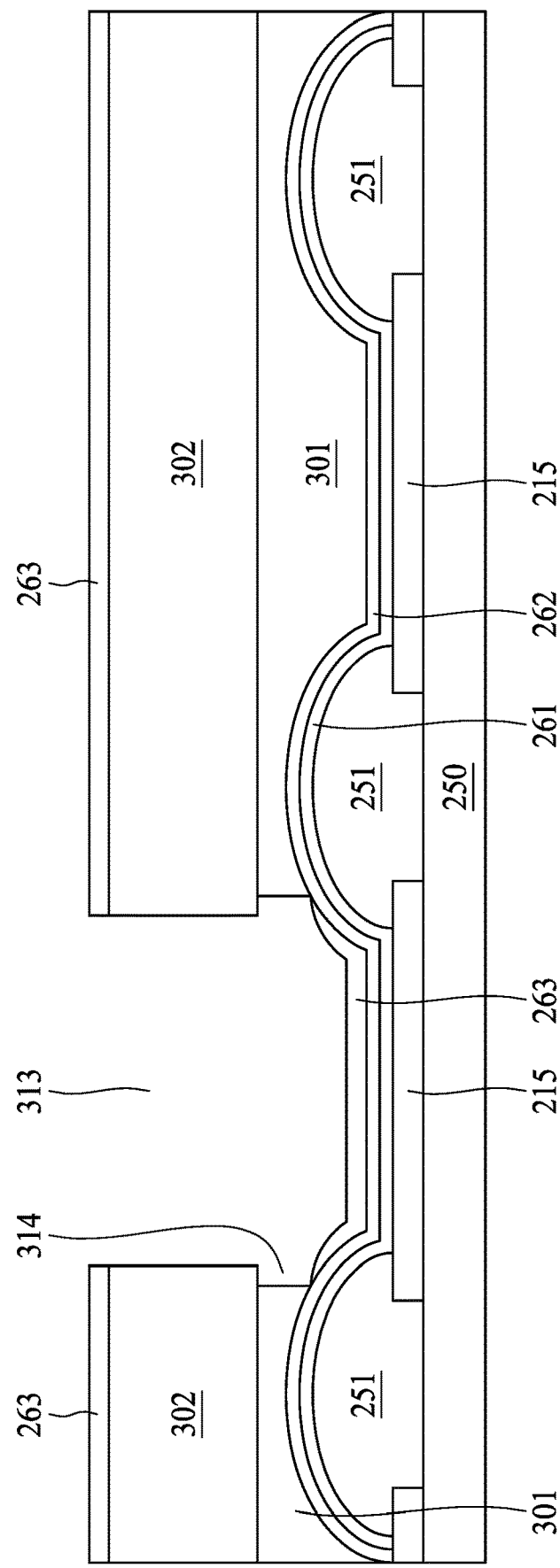

An organic emissive (EM) layer 263 is disposed into the recess 313 and covering the carrier transportation layer 262 and the photosensitive layer 302. In FIG. 16E, the EM layer 263 fully covers the exposed carrier transportation layer 262. The EM layer 263 is configured to emit a first color.

Figure 16F:
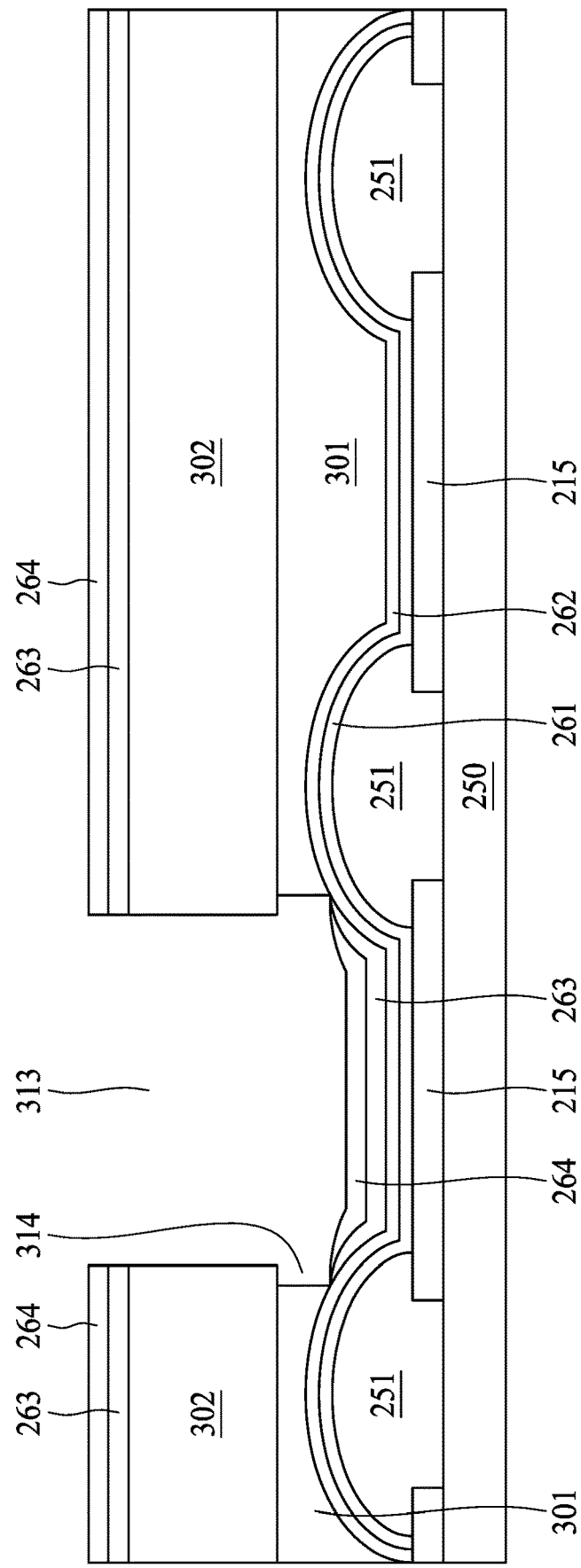

An organic carrier transportation layer 264 (or called second type carrier transportation layer) is disposed over the EM layer 263 as shown in FIG. 16F. The organic carrier transportation layer 264 can be a hole or electron transportation layer 264. In some embodiments, the organic carrier transportation layer 264 and the carrier transportation layer 262 is repectively configured for opposite types of charges.

Figure 16G:
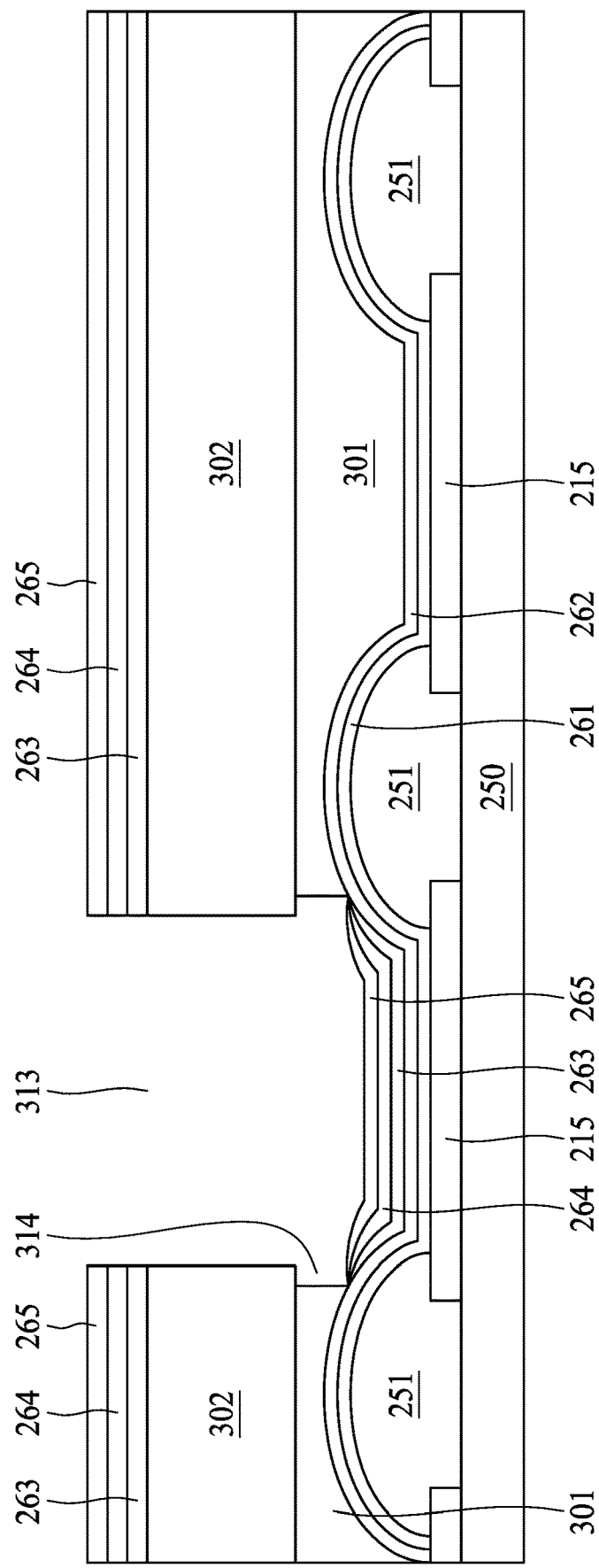

In FIG. 16G, a second electrode 265 can be disposed over the organic carrier transportation layer 264. A top surface of the photosensitive layer 302 is also covered by the second electrode 265. The photosensitive layer 302 can be removed after forming the second electrode 265. The second electrode 265 can be metallic material such as Ag, Mg, etc. In some embodiments, the second electrode 265 includes ITO (indium tin oxide), or IZO (indium zinc oxide). In some embodiments, each light emitting unit has an independent second electrode 265 from a cross sectional point of view and several light emitting units share a common carrier transportation layer 264.

Figure 17A:
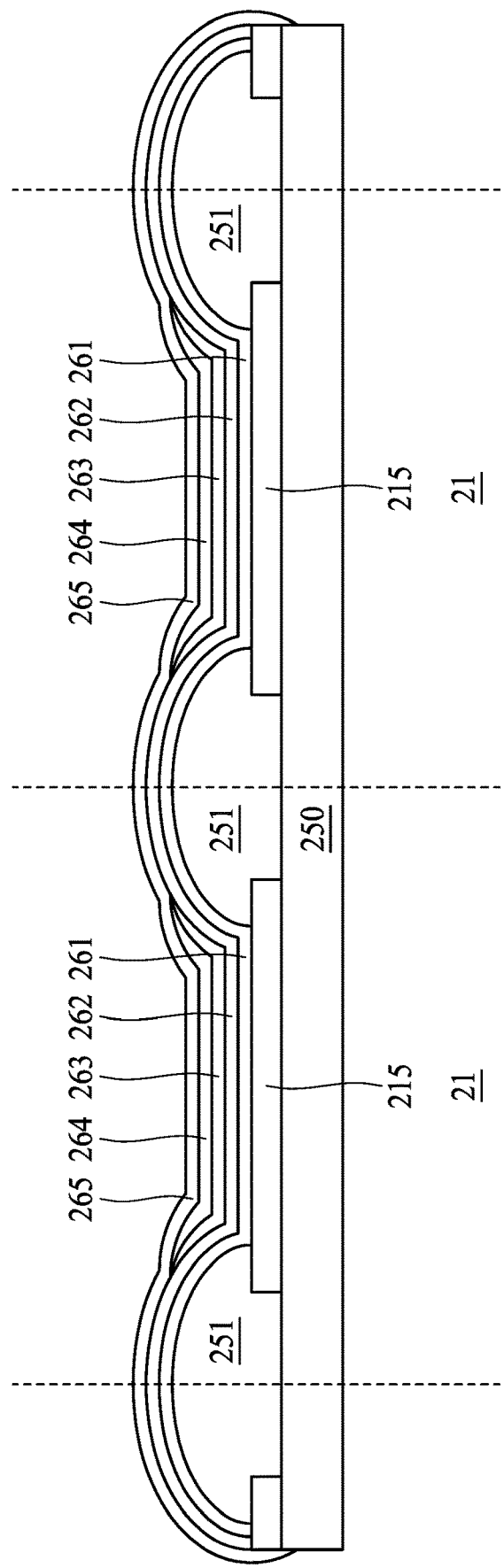
FIG. 17A is cross sectional view of a portion of a light emitting device according to an embodiment.

Similar operations like FIG. 16A-16G can be repeated to form a different colored light emitting unit. FIG. 17A illustrates another light emitting unit emitting a second color, which is different from the first color. The second electrode 265 for the first light emitting unit 21 and the second light emitting unit 22 is continuous. Each light emitting unit has an independent carrier transportation layer 264. The independent carrier transportation layer 264 is segmented to have several pieces and each piece is disposed in one light emitting unit. In some embodiments, several light emitting units share a common carrier transportation layer 264. In some embodiments, the light emitting units are configured into at least three different groups and each group emits a color different than the others. Two of the at least three different groups use a common carrier transportation layer 264 and the carrier injection layer 264 for the other one group is not common to the other two groups. In some embodiments, the red group and green group light emitting units use a common carrier transportation layer 262, and the blue group light emitting units uses a carrier transportation layer 262 independent from the common carrier transportation layer 262.

Figure 17B:
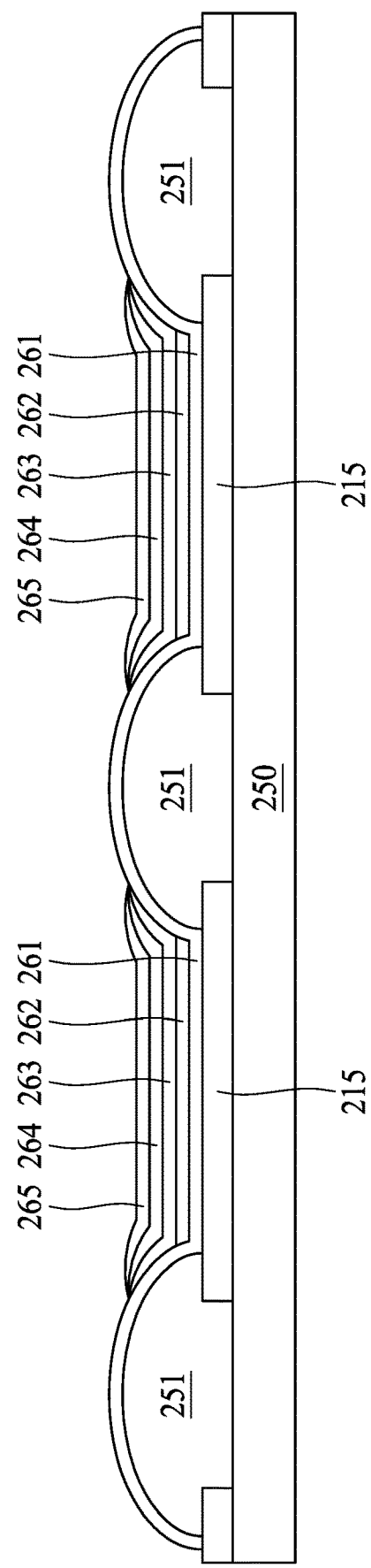
FIG. 17B is cross sectional view of a portion of a light emitting device according to an embodiment.

In some embodiments, each light emitting unit has an independent carrier transportation layer 262 (proximal to the first electrode 215 comparing to the carrier transportation layer 264) as in FIG. 17B. The carrier transportation layer 262 is segmented to have several pieces and each piece is disposed in one light emitting unit. In some embodiments, several light emitting units share a common carrier transportation layer 262. Each light emitting unit has an independent carrier injection layer 261. The carrier injection layer 261 is segmented to have several pieces and each piece is disposed in one light emitting unit. In some embodiments, several light emitting units share a common carrier injection layer 261.

In some embodiments, the second carrier transportation layer 264 has at least two sub-layers. The first sub-layer is between the second sublayer and the EM layer 263. In some embodiments, the second sublayer is between the first sublayer and the electrode. In some embodiments, both sublayers are continuous and light emitting units 21 and 22 use common first sub-layer and second sublayer. In some embodiments, one sub-layer is segmented and ther other one is continuous. In some embodiments, the first sublayer is continuous and the second sub-layer is segmentd. Each light emitting unit has an independent second sublayer. In some embodiments, the second sub-layer is continuous and the first sub-layer is segmentd. Each light emitting unit has an independent first sub-layer.

Figure 18A:
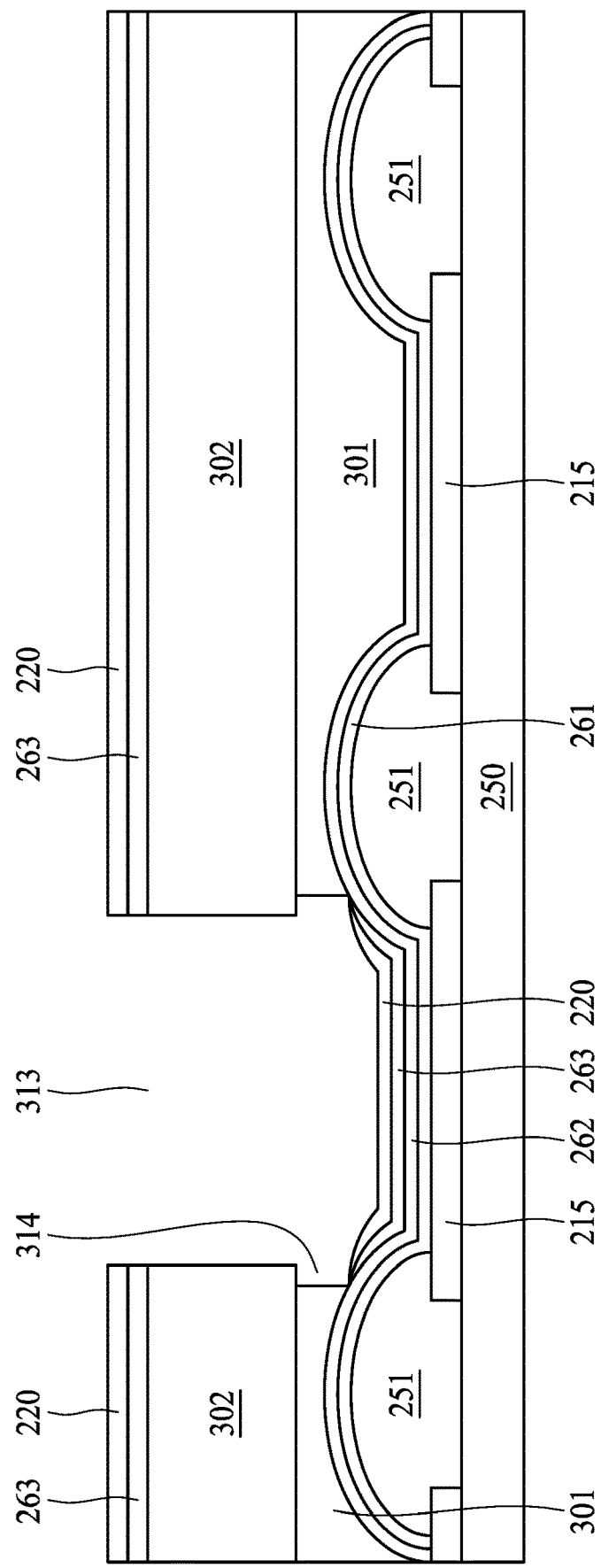
FIGS. 18A-18B illustrate a method of manufacturing a light emitting device according to an embodiment.
Figure 18B:
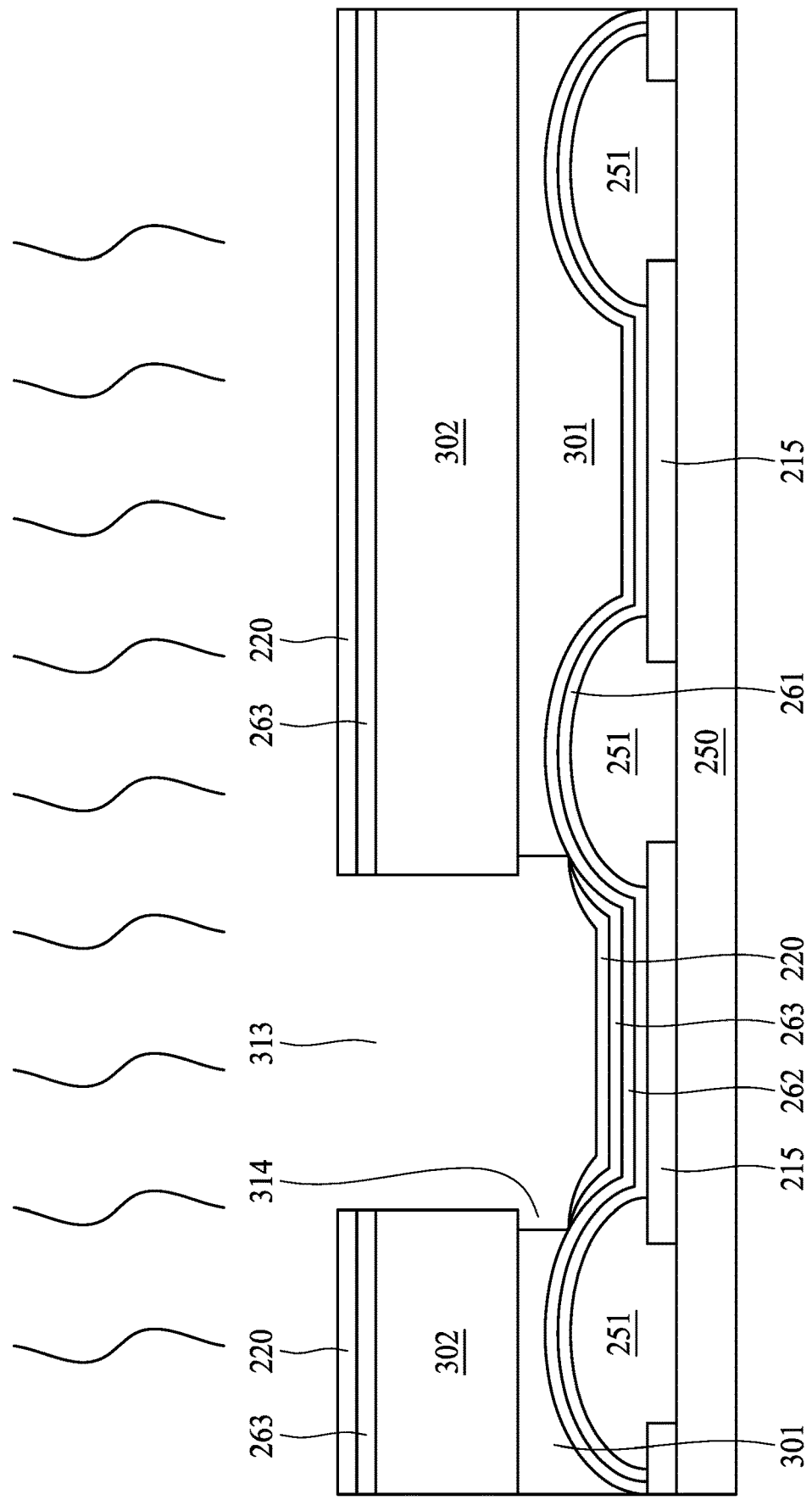

In FIG. 18A, the metal or metal complex layer 220 is disposed over the organic emissive layer 263 after the operation shown in FIG. 16E. The metal or metal complex layer 220 can be disposed by various processes such as vapor deposition, liquid jetting or printing. And after disposing the metal or metal complex layer 220, a treatment is optionally introduced to drive the metal elements into the organic emissive layer 263 as shown in FIG. 183. Then, the second carrier transportation layer 264 is followed to be disposed over the metal or metal complex layer 220. Similarly, the arrangement of each layer to be independent for each light emitting unit or commonly shared with other light emitting units can be referred to the aforementioned decryption, and the embodiments illustrated in the drawings should not be deemed as limitation.

Figure 19A:
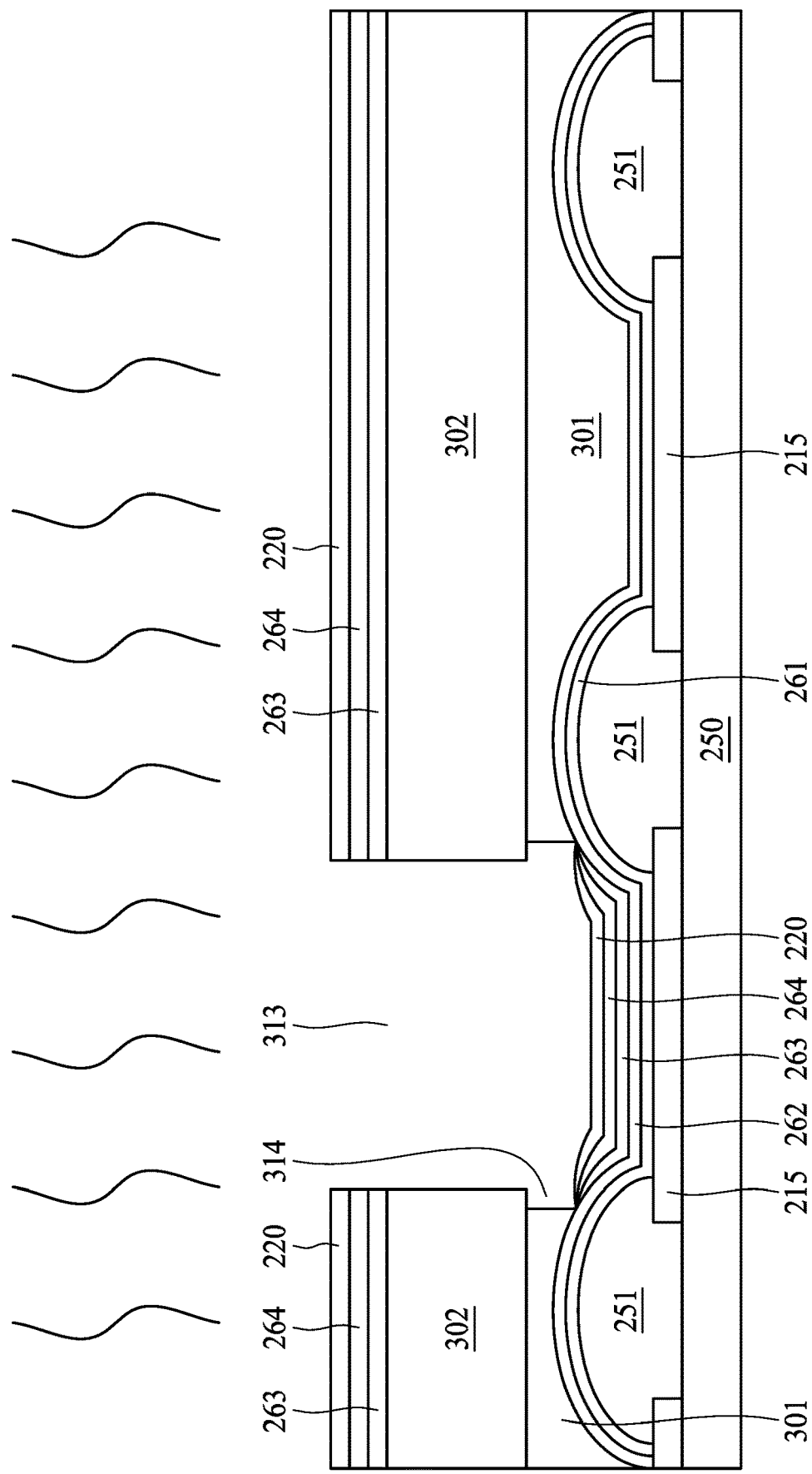
FIGS. 19A-19B illustrate a method of manufacturing a light emitting device according to an embodiment.
Figure 19B:
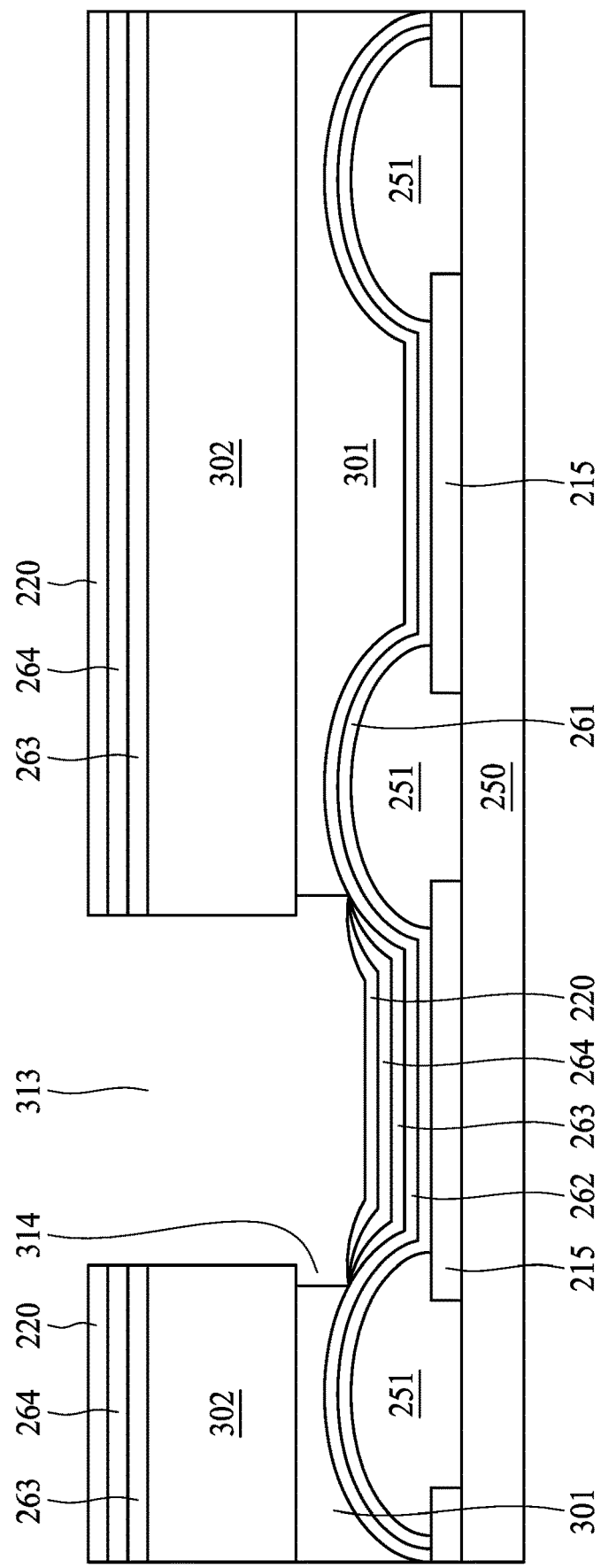

In FIG. 19A, the metal or metal complex layer 220 is disposed over the second carrier transportation layer 264 after the operation shown in FIG. 16F. The metal or metal complex layer 220 can be disposed by various processes such as vapor deposition, liquid jetting or printing. And after disposing the metal or metal complex layer 220, a treatment is optionally introduced to drive the metal elements into the second carrier transportation layer 264 as shown in FIG. 193. Similarly, the arrangement of each layer to be independent for each light emitting unit or commonly shared with other light emitting units can be referred to the aforementioned description and the embodiments illustrated in the drawings should not be deemed as limitation.

Figure 20:
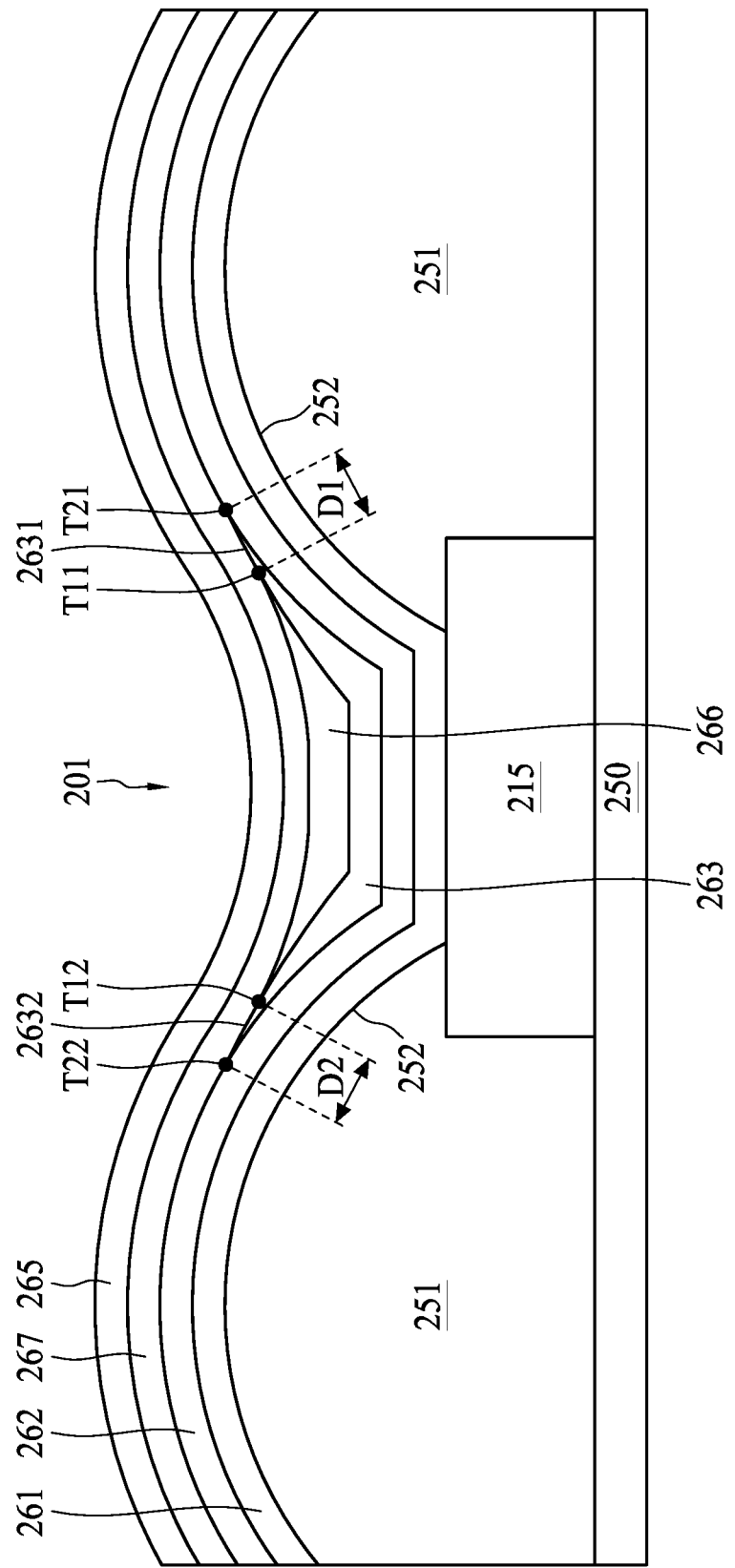
FIG. 20 is cross sectional view of a light emitting device according to an embodiment.
Figure 21:
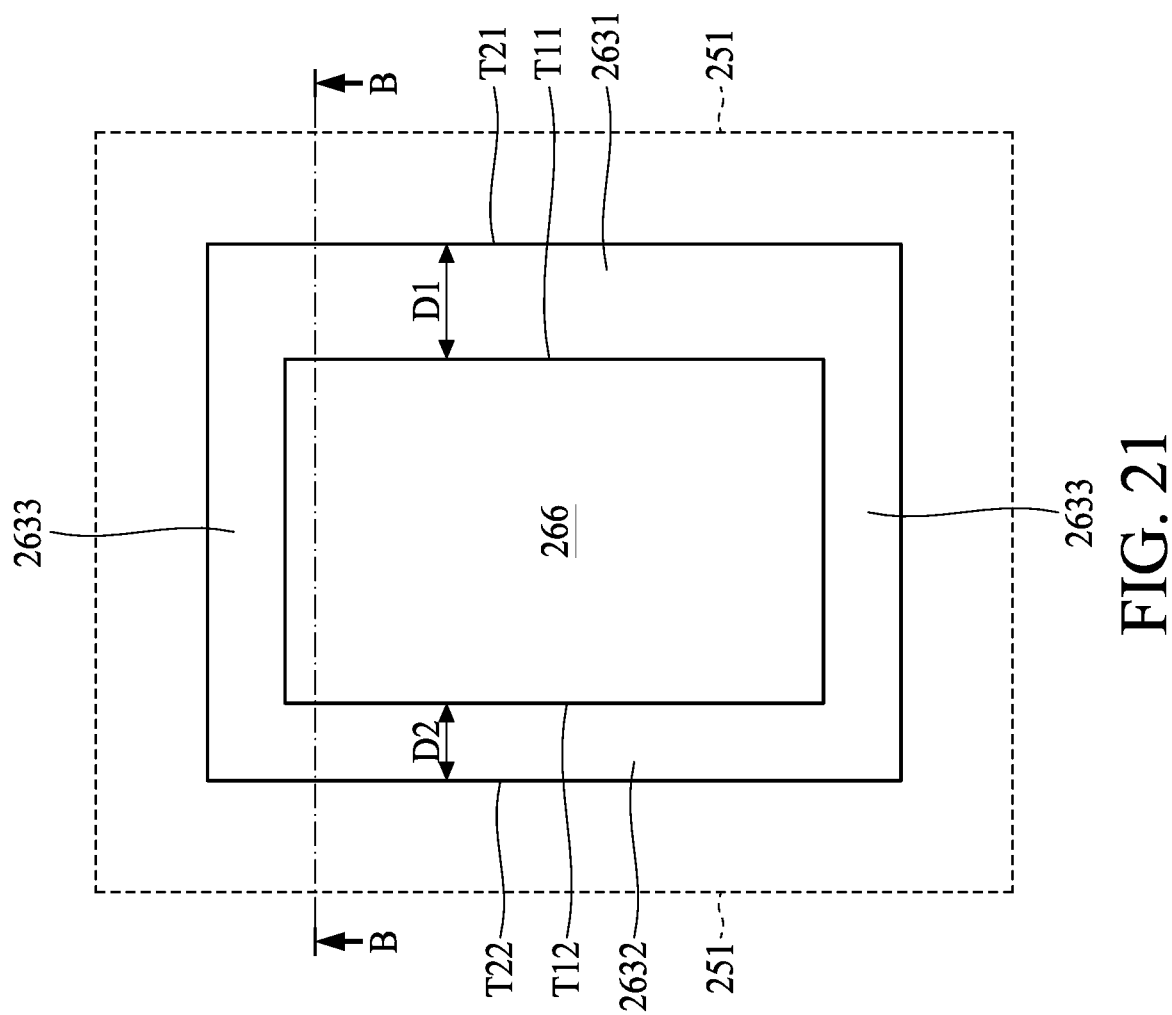
FIG. 21 a top view of a light emitting device according to an embodiment.

FIGS. 20-21 illustrate another embodiment of a light emitting device. FIG. 20 is a cross-section view of the light emitting device according to aspects of the present disclosure in some embodiments. The light emitting device includes substrate 250, bumps 251 over the substrate 250, a light emitting unit 201 between the bumps 251 and over the substrate 250.

The light emitting unit 201 includes an electrode 215, an organic emissive layer 263 over the electrode 215, and a first electron transportation layer 266 over the organic emissive layer 263. The light emitting unit 201 may also have a metal-containing layer 267 over the first electron transportation layer 266. It is to be noted that the electron transportation layer used herein is exemplary, and not limited to be applied to other different type carrier, such as hole, etc.

As seen from a cross-sectional perspective, a first end of the first electron transportation layer 266 meets the organic emissive layer 263 and the metal-containing layer 267 at a first meeting point T11. The organic emissive layer 263 has a first end which is proximal to the first meeting point T11, and the first end of the organic emissive layer 263 meets the metal-containing layer 267 at a second meeting point T21. The organic emissive layer 263 further has a second end. Compared to the second end, the first end of the organic emissive layer 263 is closer to the point T11. The point T21 is spaced apart from the point T11 and away from the first electron transportation layer 266. In some cases, the point T21 is closer to an apex of the bump 251 than the point T11.

An interface 2631 is between the metal-containing layer 267 and the organic emissive layer 263. The interface 2631 ranges from the point T11 to the point T21. In some embodiments, a vertical distance between the second meeting point T21 and the substrate 250 is greater than or equal to a vertical distance between the point T11 and the substrate 250.

Similarly, a second end, which is opposite to the first end, of the first electron transportation layer 266 meets the organic emissive layer 263 and the metal-containing layer 267 at a first meeting point T12. The second end of the organic emissive layer 263 which is proximal to the point T12 meets the metal-containing layer 267 at a second meeting point T22. The point T22 is spaced apart from the point T12 and away from the first electron transportation layer 266. In some cases, the point T22 is closer to an apex of the bump 251 than the point T12.

Similarly, another interface 2632 is between the metal-containing layer 267 and the organic emissive layer 263. The interface 2632 ranges from the point T12 to the point T22. In some embodiments, the interface 2631 and the interface 2632 are located at the two opposite ends of the organic emissive layer 263. In some embodiments, a vertical distance between the point T22 and the substrate 250 is greater than or equal to a vertical distance between the point T12 and the substrate 250.

FIG. 21 is a top view of the light emitting unit 201 shown in FIG. 20. (FIG. 20 is a cross-section view along line B-B of FIG. 21.) Shape of the interface 2631 and the interface 2632 is arranged in rectangle, however, various shapes can be adopted per designer's preference. The surface area of each interface depends on the distance between the points T11, T21 and their corresponding points T21, T22 at the same end. The surface area of the interface 2631 and the surface area of the interface 2632 may be same or different.

Another interface 2633 between the organic emissive layer 263 and the metal-containing layer 267 is shown in FIG. 21. Interfaces 2631, 2632 and 2633 can be merged into a continuous ring. The ring pattern is the periphery of the organic emissive layer 263. The width of the ring pattern may not be uniform and may vary by sections. For example, the width of the interface 2631 may be different from the interface 2632 in a same ring. In some embodiments, the ring of the organic emissive layer 263 surrounds the first electron transportation layer 266. From top view, meeting points T11 and T21 are the boarders of interface 2633.

Referring back to FIG. 20, in some embodiments, each bump 251 has a surface 252 protruding away from the substrate 250. The surface 252 of the bump 251 may be curved. The end portions of the organic emissive layer 263 may be extended toward an apex of the bump 251 and disposed over a portion of the surface 252 of the bump 251.

In some embodiments, a carrier (opposite type to the carrier of transportation layer 266) injection layer 261 is disposed over and continuously lining along the surfaces 252 of the bumps 251 and the first electrode 215. In some embodiments, a carrier transportation layer 262 (same type as the carrier of injection layer 261) is disposed over and continuously lining along the carrier injection layer 261, and the organic emissive layer 263 is disposed over the carrier transportation layer 262. In some embodiments, the carrier injection layer 261 is a hole injection layer. In some embodiments, the carrier transportation layer 262 is a hole transportation layer. In some embodiments, the metal-containing layer 267 is in contact with organic emissive layer 263, the first transportation layer 266, and the carrier transportation layer 262. In some embodiments, the metal-containing layer 267 meets the organic emissive layer 263 and the carrier transportation layer 262 at the points T21, T22.

In some embodiments, a first distance D1 between the first meeting point T11 and the second meeting point T21 is greater than zero. In some embodiments, a second distance D2 between the first meeting point T12 and the second meeting point T22 is equal to or greater than 0. The second distance D2 may be similar to the first distance D1. The second distance D2 may be different from the first distance D1. In some embodiments, a vertical distance between the second meeting point T21 and the substrate 250 may be similar to or different from a vertical distance between the second meeting point T22 and the substrate 250.

The thickness of the first electron transportation layer 266 may be greater than the thickness of the metal-containing layer 267. In some embodiments, a ratio of the thickness of the metal-containing layer 267 to the thickness of the first electron transportation layer 266 is between 0.1 and 0.7. The metal-containing layer 267 may have a thickness between 0.1 to 50 nm. In some embodiments, the metal-containing layer 267 has a thickness between 0.1 to 5 nm.

In some embodiments, compared to the thickness of the metal-containing layer 267, the thickness of the first electron transportation layer 266 is non-uniform. Compare to the upper surface of the metal-containing layer 267, the upper surface of the first electron transportation layer 266 may be rough. In some embodiments, compare to the interface between the first electron transportation layer 266 and organic emissive layer 263 and ranging from point T11 to point T12, the interface between the first electron transportation layer 266 and the metal-containing layer 267 is undulating. The uniformity of the metal-containing layer 267 could be better than that of the first electron transportation layer 266. In some embodiments, the metal-containing layer 267 is conformal to the underlying layers, which includes the first electron transportation layer 266, the periphery of the organic emissive layer 263, and the carrier transportation layer 262 disposing on the bumps 251. In some embodiments, compare to the interface between the first electron transportation layer 266 and organic emissive layer 263 and ranging from point T11 to point T12, the interfaces 2631, 2632 of the organic emissive layer 263 are rough.

At least one of the first electron transportation layer 266 and the metal-containing layer 267 includes transitional metal or alkali metal. In some embodiments, least one of the first electron transportation layer 266 and the metal-containing layer 267 includes a material selected from a group consisting of: halogen alkali salt, alkali metal oxide, alkali coordination complex, alkaline earth carbonate, Yb, alkali metal, alkaline earth metal, and transitional metal. In some embodiments, at least one of the first electron transportation layer 266 and the metal-containing layer 267 further includes an organic material. Example of the organic material may have a resonance structure. The organic material may be benzoimidazole. In some embodiments, at least one of the first electron transportation layer 266 and the metal-containing layer 267 includes an organic material and alkali coordination complex. In some embodiments, at least one of the first electron transportation layer 266 and the metal-containing layer 267 includes benzoimidazole and lithium coordination complex. In some embodiments, at least one of the first electron transportation layer 266 and the metal-containing layer 267 includes

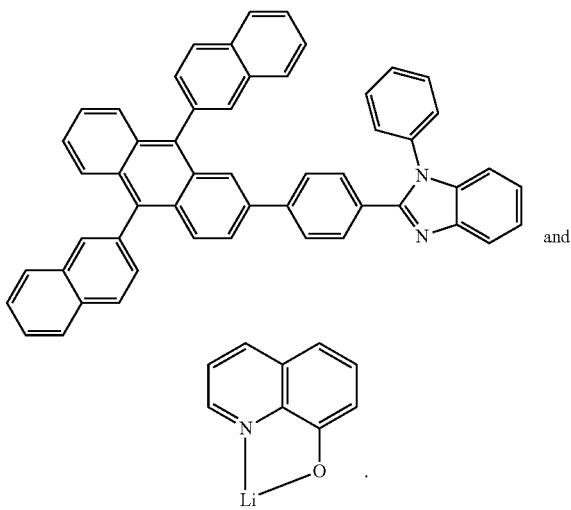

and

In some embodiments, the first electron transportation layer 266 and the metal-containing layer 267 include the same material.

In some embodiments, the first electron transportation layer 266 is configured to perform electron transportation and electron injection. In some embodiments, the metal-containing layer 267 is configured to perform of electron transportation and electron injection. In some embodiments, the metal-containing layer 267 is a second electron transportation layer. In some embodiments, the metal-containing layer 267 is an electron injection layer.

In some embodiments, the second electrode 265 (opposite type to the first electrode 215) is disposed over the metal-containing layer 267. The upper surface of the metal-containing layer 267 may be covered by the second electrode 265. In some embodiments, the light emitting unit 201 further includes an electron injection layer. The electron injection layer may be dispose between the second electrode 265 and the metal-containing layer 267 when the metal-containing layer 267 has the function of electron transportation. The electron injection layer may dispose over and continuously lining along the surfaces of the metal-containing layer 267.

Figure 22:
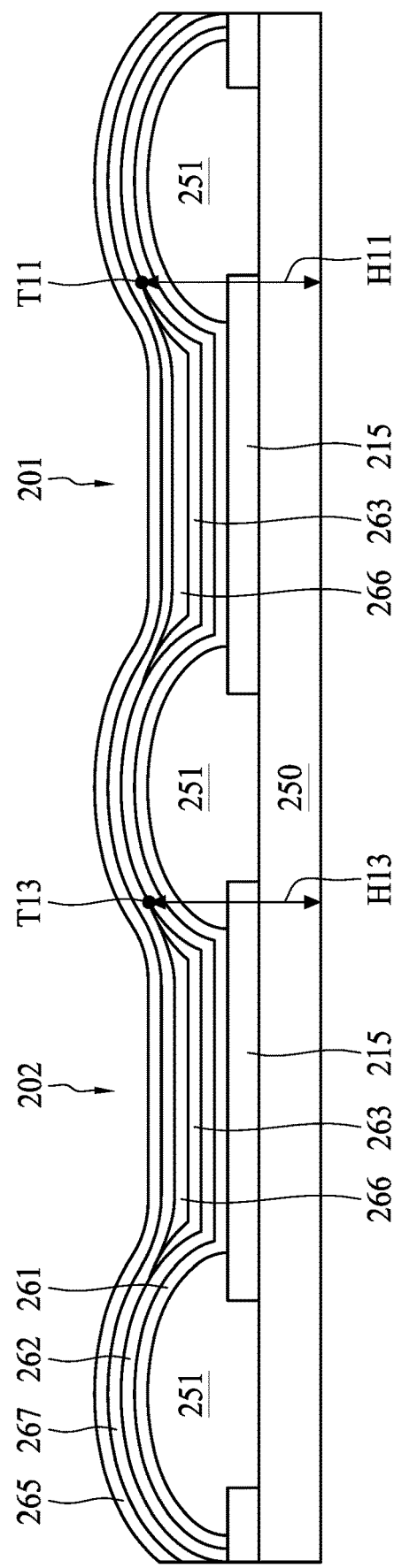
FIG. 22 is cross sectional view of a light emitting device according to an embodiment.
Figure 23:
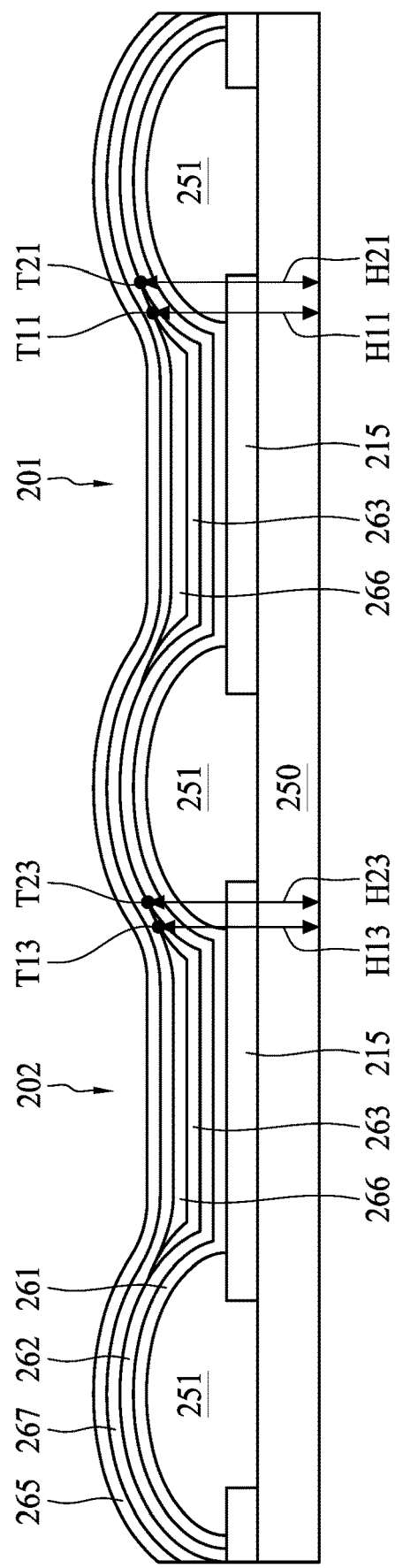
FIG. 23 is cross sectional view of a light emitting device according to an embodiment.

FIG. 22 is a cross-section view illustrating another embodiment of the light emitting device. Referring to FIG. 22, in some embodiment, a light emitting device includes substrate 250, bumps 251 over the substrate 250, a first light emitting unit 201 and a second light emitting unit 202 between the bumps 251 and over the substrate 250.

The first light emitting unit 201 is as described above or shown in FIGS. 20 and 21, and the second light emitting units 202 is in configurations similar to the first light emitting unit 201. Additionally, while the first and second light emitting units 201, 202 are illustrated as having similar features, this is intended to be illustrative and is not intended to limit the embodiments. The first and second light emitting units 201, 202 may have similar structures or different structures in order to meet the desired functional capabilities.

The first light emitting unit 201 may differ from the second light emitting unit 202 is at least the thicknesses of the first electron transportation layers 266. In other words, thickness of the first electron transportation layers 266 of the first light emitting unit 201 is different from the thickness of the first electron transportation layer 266 of the second light emitting unit 202. In some embodiments, the first light emitting unit 201 may differ from the second light emitting unit 202 in the thickness uniformity of the first electron transportation layers 266. In some embodiments, the first electron transportation layer 266 of the first light emitting unit 201 is thicker than that of the second light emitting unit 202, and the thickness uniformity of the first electron transportation layer 266 of the first light emitting unit 201 is less than that of the first electron transportation layer 266 of the second light emitting unit 202.

The first and second light emitting units 201, 202 may have a metal-containing layer 267 over the first electron transportation layers 266 of the first and second light emitting units 201, 202. The light emitting device further includes a second electrode 265 disposed over the metal-containing layer 267. In some embodiments, the light emitting device further includes a carrier (opposite type to the carrier of transportation layer 266) injection layer 261 disposed over and continuously lining along the bumps 251 and the first electrode 215. In some embodiments, the light emitting device further includes a carrier transportation layer 262 (same type as the carrier of injection layer 261) disposed over and continuously lining along the carrier injection layer 261. The organic emissive layers 263 may be disposed between the carrier transportation layer 262 and the corresponding first electron transportation layers 266.

In some embodiments, the first light emitting unit 201 and the second light emitting unit 202 are adjacent to each other. In some embodiments, the light emitting device includes a plurality of light emitting units, and the first and second light emitting units 201, 202 can be any two of the plurality of light emitting units. An ordinarily skilled person in the art would readily understand that any suitable number of the light emitting units may alternatively be utilized, and all such combinations are fully intended to be included within the scope of the embodiments.

In some embodiments, the metal-containing layer 267 is segmented to have several pieces as seen from a cross-section view and each piece is disposed in one light emitting unit. In some embodiments, the first and second light emitting units 201, 202 share a common metal-containing layer 267. The metal-containing layer 267 is over the bumps 251 and the first electron transportation layers 266 of the first and second light emitting units 201, 202. In some embodiments, the second electrode 265 is segmented to have several pieces and each piece is disposed in one light emitting unit. In some embodiments, the first and second light emitting units 201, 202 share a common second electrode 265.

In some embodiments, the first light emitting unit 201 is configured to display a first color and the second light emitting unit 202 is configured to display a second color different from the first color. Thickness of the first electron transportation layer 266 may be related to the color displayed by the corresponding light emitting unit. In some embodiments, when the first color is green and the second color is red or blue, or when the first color is red and the second color is blue. The first electron transportation layer 266 of the first light emitting unit 201 is thinner than the first electron transportation layer 266 of the second light emitting unit 202.

Each of the first and second light emitting units 201, 202 includes a first meeting point T11, T13. Each of the points T11, T13 is where one end of the first electron transportation layer 266 meets the corresponding organic emissive layer 263 and the metal-containing layer 267. In some embodiments, each of the first and second light emitting units 201, 202 includes two first meeting points T11, T13 located at the two opposite ends of the first electron transportation layer 266 as seen from a cross-section view.

In some embodiments, since the thickness of the first electron transportation layers 266 are different, a vertical distance H11 between the point T11 and the substrate 250 is different from a vertical distance H31 between the point T13 and the substrate 250. In some embodiments, each of the points T11, T13 is where one end of the first electron transportation layer 266 meets the corresponding organic emissive layer 263, the carrier transportation layer 262 and the metal-containing layer 267.

FIG. 22 is a cross-section view illustrating the light emitting device in some embodiments. Referring to FIG. 22, in some embodiments, each of the first and second light emitting units 201, 202 further includes a second meeting point T21, T23. Each of the organic emissive layers 263 has an end which is close to the corresponding point T11, T13. The end of each organic emissive layer 263 meets the metal-containing layer 267 at the corresponding point T21, T23. Each of the point T21, T23 is spaced apart from the corresponding point T11, T13 and away from the corresponding organic emissive layer 263. In some embodiments, each of the first and second light emitting units 201, 202 has two second meeting points T21, T23 located at the two opposite ends of the organic emissive layer 263.

In some embodiments, each of the first and second light emitting units 201, 202 includes an interface between the corresponding organic emissive layer 263 and the metal-containing layer 267. One of the interface ranges from the point T11 to point T21, the other interface ranges from the point T13 to the point T23. In some embodiments, a vertical distance H21 between the point T21 and the substrate 250 is different from a vertical distance H23 between the point T23 and the substrate 250.

In some embodiments, the distance between the point T11 and the point T21 is different from the distance between the point T13 and the s point T23.

In some embodiments, the light emitting device further includes a third light emitting unit. The third light emitting unit is in configurations similar to the first light emitting unit 201. The first, second and third light emitting units may differ from each other is at least the thicknesses of the first electron transportation layers 266.

In some embodiments, the light emitting units are configured into at least three different groups and each group emits a color different from the others. Thickness of the first electron transportation layer 266 may be related to the color displayed by the corresponding light emitting unit. In some embodiments, the first light emitting unit 201 emits green light, compared to the other first electron transportation layers 266 configured to emit different colors, the first electron transportation layer 266 of the first light emitting unit may have the thinnest thickness. In some embodiments, the second light emitting unit 202 emits red light, compared to the other first electron transportation layers 266 configured to emit different colors, the thickness of the first electron transportation layer 266 of the second light emitting unit 202 may between the thickness of the first electron transportation layer 266 of the first light emitting unit 201 and the thickness of the first electron transportation layer 266 of the third light emitting unit. In some embodiments, the third light emitting unit emits blue light, compared to the other first electron transportation layers 266 configured to emit different colors, the first electron transportation layer 266 of the third light emitting unit may have the largest thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A light emitting device, comprising:
    a substrate; and
    a light emitting unit over the substrate, wherein the light emitting unit includes:
        a first electrode;
        an organic emissive layer over the first electrode;
        a first electron transportation layer over the organic emissive layer, and a metal-containing layer over the first transportation layer;

wherein an end of the first electron transportation layer meets the organic emissive layer and the metal-containing layer at a first meeting point, the organic emissive layer has an end which is close to the first meeting point meets the metal-containing layer at a second meeting point, the second meeting point is spaced apart from the first meeting point and away from the first electron transportation layer; and wherein at least one of the first electron transportation layer and the metal-containing layer includes transitional metal or alkali metal.

2. The light emitting device in claim 1, wherein the organic emissive layer includes an interface between the metal-containing layer and the organic emissive layer, the interface ranges from the first meeting point to the second meeting point.

3. The light emitting device in claim 1, wherein the distance between the second meeting point and the substrate is greater than the distance between the first meeting point and the substrate.

4. The light emitting device in claim 1, wherein the first electron transportation layer and the metal-containing layer include the same material.

5. The light emitting device in claim 1, wherein the metal-containing layer is a second electron transportation layer.

6. The light emitting device in claim 1, wherein the metal-containing layer is an electron injection layer.

7. The light emitting device in claim 1, wherein the first electron transportation layer of the light emitting unit includes a material selected from a group consisting of: halogen alkali salt, alkali metal oxide, alkali coordination complex, alkaline earth carbonate, Yb, alkali metal, alkaline earth metal, and transitional metal.

8. The light emitting device in claim 1, wherein a ratio of a thickness of the metal-containing layer to a thickness of the first electron transportation layer is between 0.1 and 0.7.

9. The light emitting device in claim 1, wherein a thickness uniformity of the first electron transportation layers is greater than the thickness uniformity of the metal-containing layer.

10. A light emitting device, comprising:
a substrate;
a plurality of bumps over the substrate;
a first light emitting unit and a second light emitting unit between the bumps and over the substrate, wherein each of the first and second light emitting units includes a first electrode and an organic emissive layer over the first electrode; and a first electron transportation layer over the organic emissive layer, at least one of the first electron transportation layer and a metal-containing layer includes transitional metal or alkali metal; and the metal-containing layer over the first electron transportation layers of the first and second light emitting units;
wherein the thickness of the first electron transportation layer of the first light emitting unit is different from the thickness of the first electron transportation layer of the second light emitting unit.

11. The light emitting device in claim 10, wherein each of the first electron transportation layer has an end, the end of each first electron transportation layer meets the corresponding organic emissive layer and the metal-containing layer at a first meeting point, a vertical distance between the first meeting point of the first light emitting unit and the substrate is different from a vertical distance between the first meeting point of the second light emitting unit and the substrate.

12. The light emitting device in claim 11, wherein each of the organic emissive layer has an end which is close to the corresponding first meeting point, the end of the organic emissive layer meets the metal-containing layer at a second meeting point, each of the second meeting point is spaced apart from the corresponding first meeting point and away from the corresponding first electron transportation layer.

13. The light emitting device in claim 12, wherein a vertical distance between the second meeting point of the first light emitting unit and the substrate is different from a vertical distance between the second meeting point of the second light emitting unit and the substrate.

14. The light emitting device in claim 10, wherein a thickness of the first electron transportation layer of the first light emitting unit is greater than a thickness of the second light emitting unit, and a thickness uniformity of the first electron transportation layer of the first light emitting unit is less than a thickness uniformity of the first electron transportation layer of the second light emitting unit.

15. The light emitting device in claim 10, wherein the metal-containing layer over the plurality of bumps and the first electron transportation layers of the first and second light emitting units.

16. The light emitting device in claim 10, wherein the first light emitting unit is configured to display a first color and the second light emitting unit is configured to display a second color different from the first color.

17. A light emitting device, comprising:
a substrate;
a plurality of bumps over the substrate;
a first light emitting unit and a second light emitting unit between the plurality of bumps and over the substrate, wherein each of the first and second light emitting units includes a first electrode and an organic emissive layer over the first electrode; and a first electron transportation layer over the organic emissive layer, wherein the first electron transportation layer includes transition metal or alkali metal; and
a metal-containing layer over the first electron transportation layers of the first and second light emitting units,
wherein each of the first and second light emitting units includes a first meeting point and a second meeting point, one end of the each first electron transportation layer meets the corresponding organic emissive layer and the metal-containing layer at the first meeting point, each organic emissive layer has an end close to the corresponding first meeting point, the end of each organic emissive layer meets the metal-containing layer at the second meeting point, the second meeting point is spaced apart from the corresponding first meeting point and away from the corresponding organic emissive layer;
the distance between the first meeting point of the first light emitting unit and the second meeting point of the first light emitting unit is different from the distance between the first meeting point of the second light emitting unit and the second meeting point of the second light emitting unit.

18. The light emitting device in claim 17, wherein the metal-containing layer over the plurality of bumps and the first electron transportation layers of the first and second light emitting units.

* * * * *